(12) United States Patent
Shin et al.

(10) Patent No.: US 10,692,899 B2
(45) Date of Patent: Jun. 23, 2020

(54) DISPLAY DEVICE AND METHOD OF MANUFACTURING THE SAME

(71) Applicant: Samsung Display Co., Ltd., Yongin, Gyeonggi-do (KR)

(72) Inventors: Dong Hee Shin, Asan-si (KR); Dong Hyeon Ki, Asan-si (KR); Kyung Ho Kim, Seongnam-si (KR); Bo Yeong Kim, Asan-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 15/064,173

(22) Filed: Mar. 8, 2016

(65) Prior Publication Data
US 2017/0053949 A1   Feb. 23, 2017

(30) Foreign Application Priority Data
Aug. 21, 2015   (KR) .................. 10-2015-0118153

(51) Int. Cl.
*G02F 1/1362*   (2006.01)
*G02F 1/1333*   (2006.01)
(Continued)

(52) U.S. Cl.
CPC ........ *H01L 27/1248* (2013.01); *G02F 1/1339* (2013.01); *G02F 1/1345* (2013.01); *G02F 1/1368* (2013.01); *G02F 1/13394* (2013.01); *G02F 1/133345* (2013.01); *G02F 1/136209* (2013.01); *G02F 1/136227* (2013.01); *G02F 1/136286* (2013.01); *G02F 2001/13398* (2013.01); *G02F 2001/133388* (2013.01); *G02F 2001/136222* (2013.01); *G02F 2201/121* (2013.01)

(58) Field of Classification Search
CPC .......... H01L 27/1248; G02F 1/133345; G02F 1/1368; G02F 1/13394; G02F 1/136227; G02F 1/136286; G02F 1/136209; G02F 1/1345; G02F 1/1339; G02F 2201/121; G02F 2001/13398; G02F 2001/13622; G02F 1/133509; G02F 1/133512; G02F 2001/1351; G02F 2001/136222; G02F 2001/133388; G09G 2300/0413
See application file for complete search history.

(56) References Cited

U.S. PATENT DOCUMENTS 9,666,646 B2 * 5/2017 Toya .................. H01L 27/322
2004/0227895 A1 * 11/2004 Yoo .................. G02F 1/133516
349/152

(Continued)

OTHER PUBLICATIONS

European Search Report for European Patent Application No. 16170541.3 dated Jan. 27, 2017, 8 pages.

*Primary Examiner* — Michael H Caley
*Assistant Examiner* — Mariam Qureshi
(74) *Attorney, Agent, or Firm* — Innovation Counsel LLP

(57) ABSTRACT

A display device is provided. A display device comprising: a first substrate comprising a display area and a non-display area and placed to face each other; a light-blocking pattern comprising an opening part formed on the first substrate in the non-display area; and a dummy color layer disposed under the opening part on the first substrate at a location corresponding to the opening part, wherein the opening part and the dummy color layer extend in a direction.

17 Claims, 19 Drawing Sheets

(51) Int. Cl.
*H01L 27/12* (2006.01)
*G02F 1/1339* (2006.01)
*G02F 1/1345* (2006.01)
*G02F 1/1368* (2006.01)

(56) References Cited

U.S. PATENT DOCUMENTS

| | | | |
|---|---|---|---|
| 2006/0290829 A1* | 12/2006 | Kim | G02F 1/136209 |
| | | | 349/44 |
| 2011/0090445 A1* | 4/2011 | Kim | G02F 1/1339 |
| | | | 349/139 |
| 2014/0009447 A1 | 1/2014 | Kim | |
| 2015/0029428 A1* | 1/2015 | Wang | G02B 5/201 |
| | | | 349/42 |
| 2015/0261030 A1* | 9/2015 | Chen | G02F 1/1339 |
| | | | 349/106 |
| 2016/0195741 A1* | 7/2016 | Shiau | G02F 1/1337 |
| | | | 349/106 |
| 2016/0300888 A1* | 10/2016 | Wang | H01L 27/3213 |
| 2017/0299918 A1* | 10/2017 | Yu | G02F 1/133514 |
| 2018/0307079 A1* | 10/2018 | Chen | G02F 1/13439 |

* cited by examiner

DISPLAY DEVICE AND METHOD OF MANUFACTURING THE SAME

This application claims priority from Korean Patent Application No. 10-2015-0118153 filed on Aug. 21, 2015 in the Korean Intellectual Property Office, the disclosure of which is incorporated herein by reference in its entirety.

BACKGROUND OF THE DISCLOSURE

1. Field of the Disclosure

The present disclosure relates to a liquid crystal display (LCD) and a method of manufacturing the same.

2. Description of the Related Art

Generally, a liquid crystal display (LCD) includes an array substrate, a counter substrate that faces the array substrate, and a liquid crystal layer that is interposed between the array substrate and the counter substrate. The LCD includes a display area in which a plurality of pixels are arranged to display an image and a non-display area that is disposed around the display area and in which driver circuits are placed.

Recently, a high-transmittance LCD employing a color filter on array (COA) substrate in which a color filter is formed on an array substrate has been developed. In this LCD, the COA substrate may be misaligned with a counter substrate having a light-blocking member when it is coupled to the counter substrate. To prevent this problem, a black matrix on array (BOA) substrate in which a light-blocking member is formed on a COA substrate is being developed. Further, a black column spacer (BCS) is being developed. The BCS is obtained by forming a column spacer, which maintains a gap between a light-blocking pattern and a substrate, at the same time as the light-blocking pattern using the same material.

In the BOA or BCS structure, a common voltage may be applied to a common electrode disposed on the counter substrate through a conductive ball included in a sealing member. To this end, an opening for applying the common voltage may be formed in the light-blocking pattern. However, despite the formation of the opening, it may be difficult for the conductive ball and the common electrode to contact each other due to the thickness of the light-blocking pattern. To solve this problem, a dummy color filter may be placed under the opening to form a step.

In the case of a large-sized panel, the light-blocking pattern and the dummy color filter are generally manufactured using a stitch-shot method. However, in when formed using this method, the light-blocking pattern and the dummy color filter may have different stitch-shot configurations, and the opening of the light-blocking pattern may be misaligned with the dummy color filter for forming a step. As a result, a metal disposed under the opening may be exposed, and light reflected by the exposed metal may be seen.

SUMMARY

Aspects of the present disclosure provide a display device that is structured to prevent reflection by a metal disposed under a short point and a method of manufacturing the display device.

However, aspects of the present disclosure are not restricted to the ones set forth herein. The above and other aspects of the present disclosure will become more apparent to one of ordinary skill in the art to which the present disclosure pertains by referencing the detailed description of the exemplary embodiments given below.

According to an aspect of the present disclosure, there is provided a display device comprising: a first substrate and a second substrate which comprise a display area and a non-display area and are placed to face each other; a liquid crystal layer which is interposed between the first substrate and the second substrate; and a light-blocking pattern which comprises an opening part formed on the first substrate in the non-display area; and a dummy color layer which is disposed under the opening part on the first substrate at a location corresponding to the opening part, wherein the opening part and the dummy color layer extend in a direction.

The first substrate may further comprise a fan-out part disposed in the non-display area, and the opening part and the dummy color layer may extend across the fan-out part.

A length of the opening part and a length of the dummy color layer may be greater than a width of the display area.

A width of the dummy color layer may be greater than or equal to that of the opening part.

The opening part may completely overlap the dummy color layer.

The first substrate may further comprise a fan-out part disposed in the non-display area and a common voltage line exposed by the opening part, wherein the common voltage line extends in a direction to traverse the fan-out part.

The display device may further comprise a sealing member disposed in the non-display area, wherein the opening part is disposed in an area overlapped by an area inside the sealing member.

The dummy color layer may be disposed in the area overlapped by the area inside the sealing member.

The display device may further comprise a common voltage line exposed by the opening part, wherein the common voltage line is disposed in the area overlapped by the area inside the sealing member.

The sealing member may comprise a conductive member.

The display device may further comprise: a common electrode disposed on the second substrate; and a common voltage line exposed by the opening part, wherein the conductive member is disposed between the common electrode and the common voltage line to contact the common electrode and the common voltage line.

The first substrate may further comprise a fan-out part disposed in the non-display area and a light-blocking metal layer that is at least partially overlapped by the fan-out part.

The dummy color layer may be blue.

The dummy color layer may comprise a first dummy color layer and a second dummy color layer stacked sequentially, wherein the first dummy color layer and the second dummy color layer have different colors.

The first dummy color layer may be red, and the second dummy color layer may be blue.

The opening part may comprise a first opening and a second opening that are placed to face each other with the display area interposed therebetween.

The dummy color layer may comprise a first dummy color layer corresponding to the first opening and a second dummy color layer corresponding to the second opening.

The first opening and the first dummy color layer may extend across the fan-out part.

Lengths of the first and second openings and lengths of the first and second dummy color layers may be greater than the width of the display area.

According to another aspect of the present disclosure, there is provided a method of manufacturing a display device, the method comprising: forming a dummy color layer on a first substrate, which comprises a display area and a non-display area, in the non-display area to extend in a direction; and forming a light-blocking pattern on the dummy color layer, wherein the light-blocking pattern comprises an opening part that corresponds to the dummy color layer and extends in substantially the same direction as a direction in which the dummy color layer extends.

The first substrate may further comprise a fan-out part disposed in the non-display area, and the opening part and the dummy color layer may extend across the fan-out part.

A length of the opening part and a length of the dummy color layer may be greater than a width of the display area.

The opening part and the dummy color layer may be formed using a stitch-shot method.

The method may further comprise: forming a first color filter layer on the first substrate in the display area; and forming a second color filter layer on the first substrate in the display area, wherein the dummy color layer is formed at the same time as the first color filter layer or the second color filter layer.

The opening part may comprise a first opening and a second opening that are placed to face each other with the display area interposed therebetween, and the dummy color layer may comprise a first dummy color layer corresponding to the first opening part and a second dummy color layer corresponding to the second opening.

The first substrate may further comprise a fan-out part disposed in the non-display area, and the first opening and the first dummy color layer may extend across the fan-out part.

BRIEF DESCRIPTION OF THE DRAWINGS

The above and other aspects and features of the present disclosure will become more apparent by considering the detail exemplary embodiments disclosed herein with reference to the attached drawings, in which.

DETAILED DESCRIPTION

Figure 1:
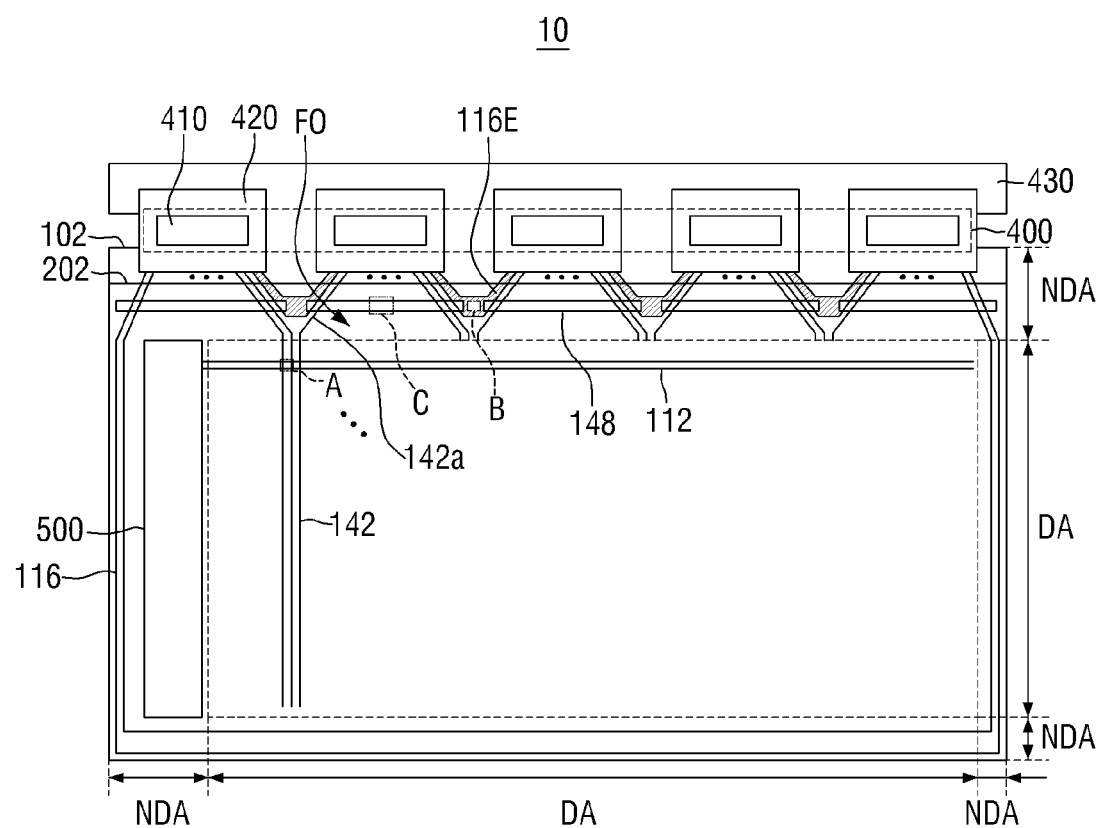
FIG. 1 is a schematic plan view of a display device according to an embodiment of the present disclosure.

In the description of the exemplary embodiments herein, like reference numerals refer to like elements throughout. The presently disclosed exemplary embodiments may be varied and should not be construed as being limiting of the present disclosure. Accordingly, the exemplary embodiments are merely described below, by referring to the figures, to explain aspects of the present disclosure.

The description that one element is connected to or coupled to another element includes both a case in which one element is directly connected to another element or a case in which an intermediate element is interposed between the elements. However, the description that one element is directly connected or directly coupled to another element indicates that there is no intermediate element between the elements. The term "and/or" includes any and all combinations of one or more of the associated listed items.

A singular expression in the present specification also includes a plural expression. The terms "comprise" and/or "comprising" do not exclude the possibility of existence or addition of one or more other components, steps, operations, and/or devices.

In the description that follows, it is assumed that a display device according to some exemplary embodiments of the present disclosure is a liquid crystal display (LCD) device, but the present disclosure is not limited thereto. That is, the present disclosure may also be applicable to various display devices, other than an LCD device.

Hereinafter, embodiments of the present disclosure are described with reference to the attached drawings.

Figure 2:
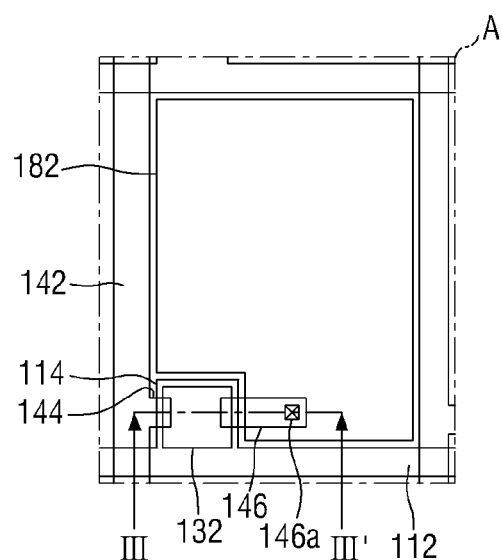
FIG. 2 is an enlarged view of an area 'A' of FIG. 1.
Figure 3:
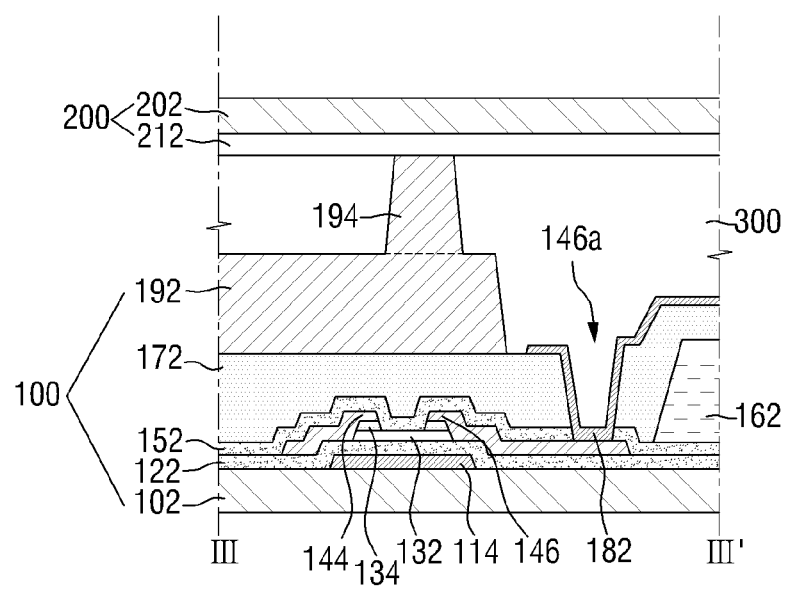
FIG. 3 is a cross-sectional view taken along the line III-III' of FIG. 2.
Figure 4:
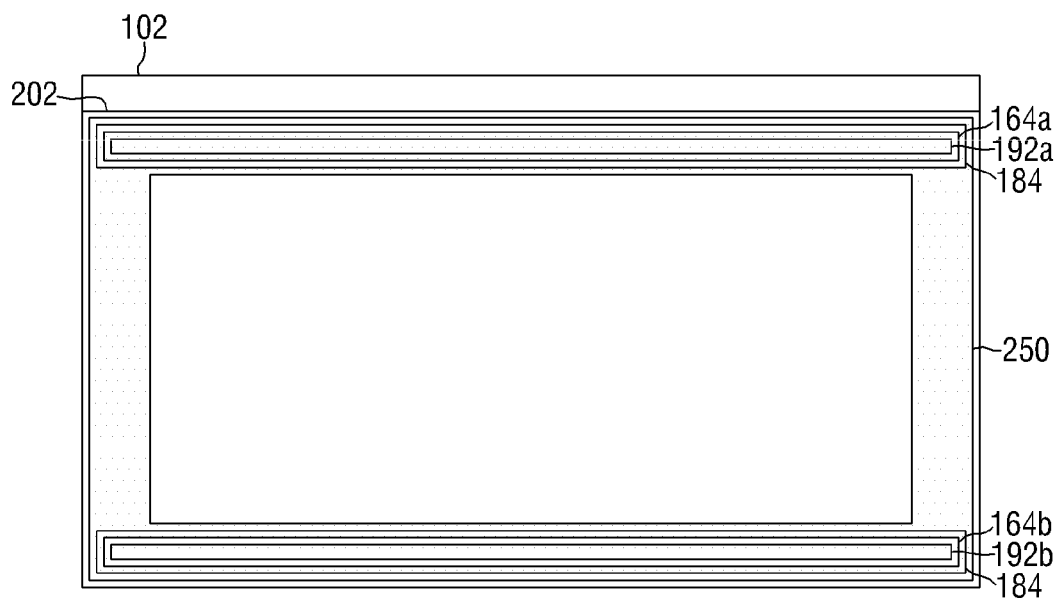
FIG. 4 is a schematic plan view of a short point structure of the display device of FIG. 1.
Figure 5:
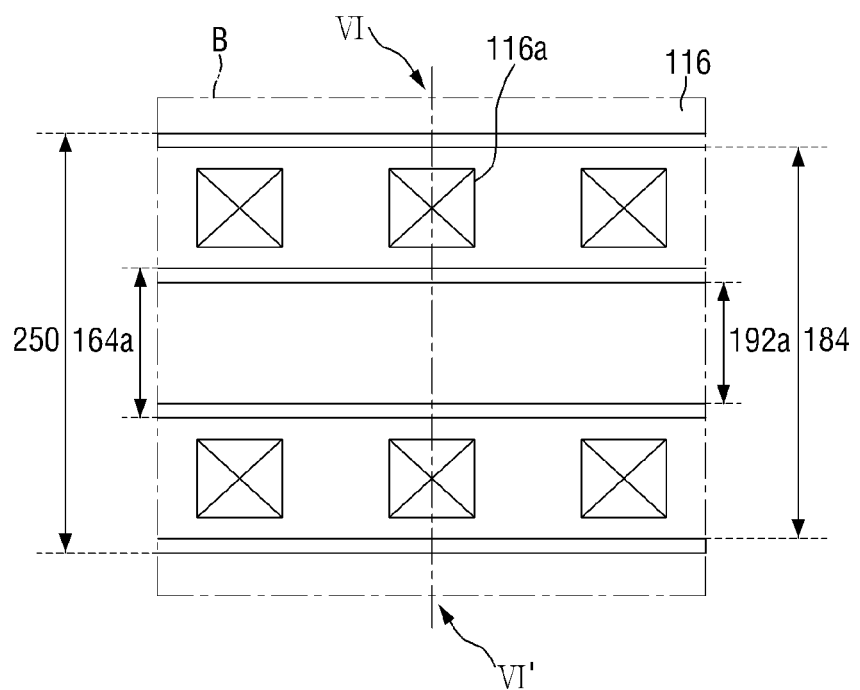
FIG. 5 is an enlarged view of an area 'B' of FIG. 1.
Figure 6:
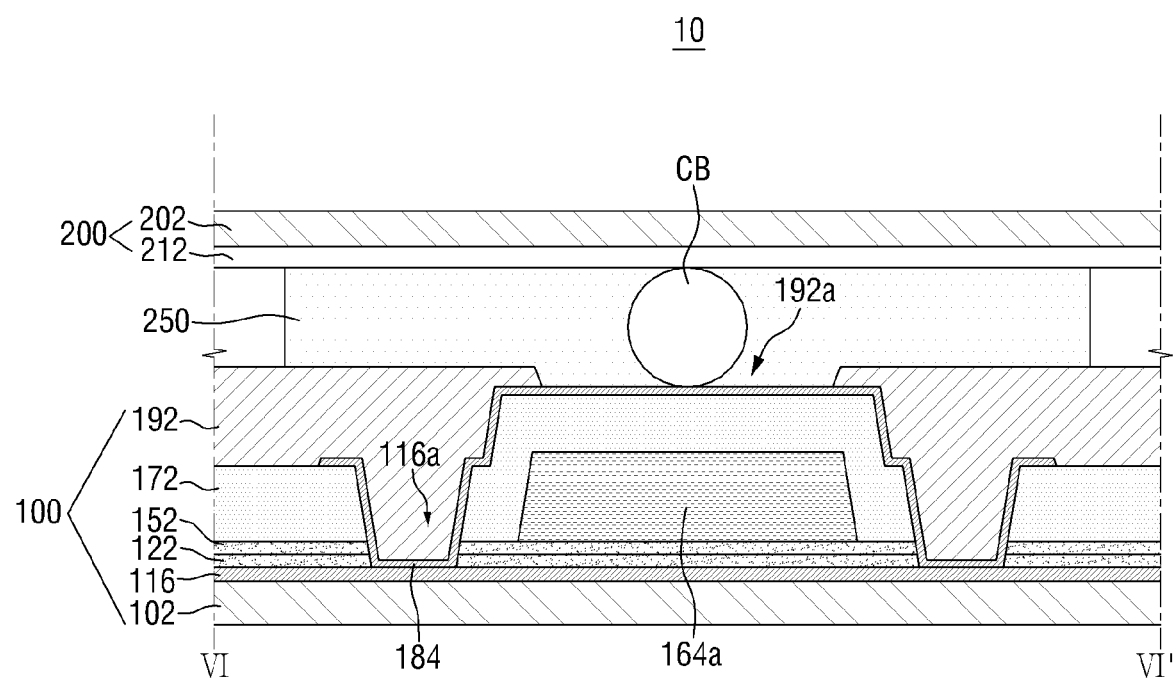
FIG. 6 is a cross-sectional view taken along the line VI-VI' of FIG. 5.
Figure 7:
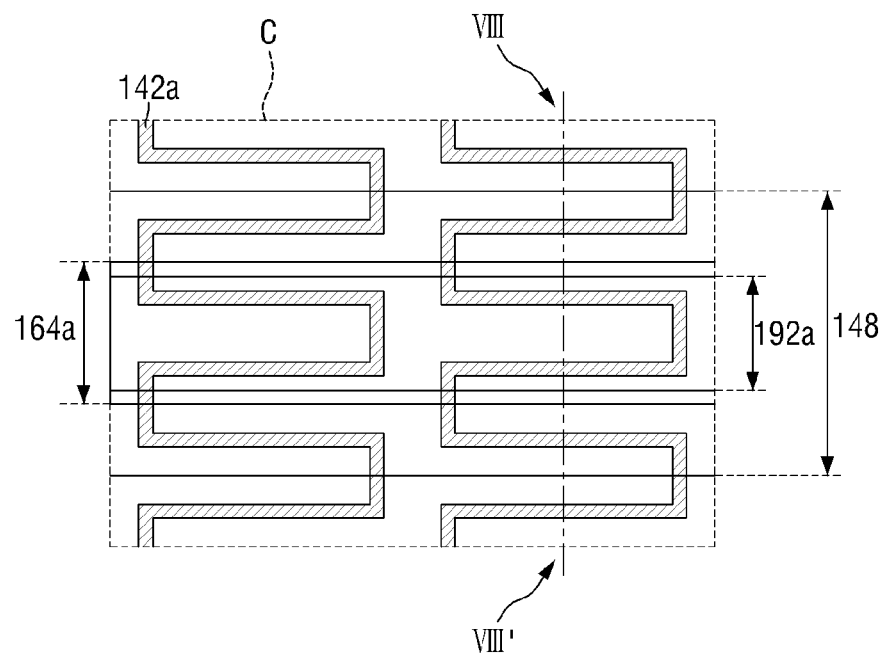
FIG. 7 is an enlarged view of an area 'C' of FIG. 1.
Figure 8:
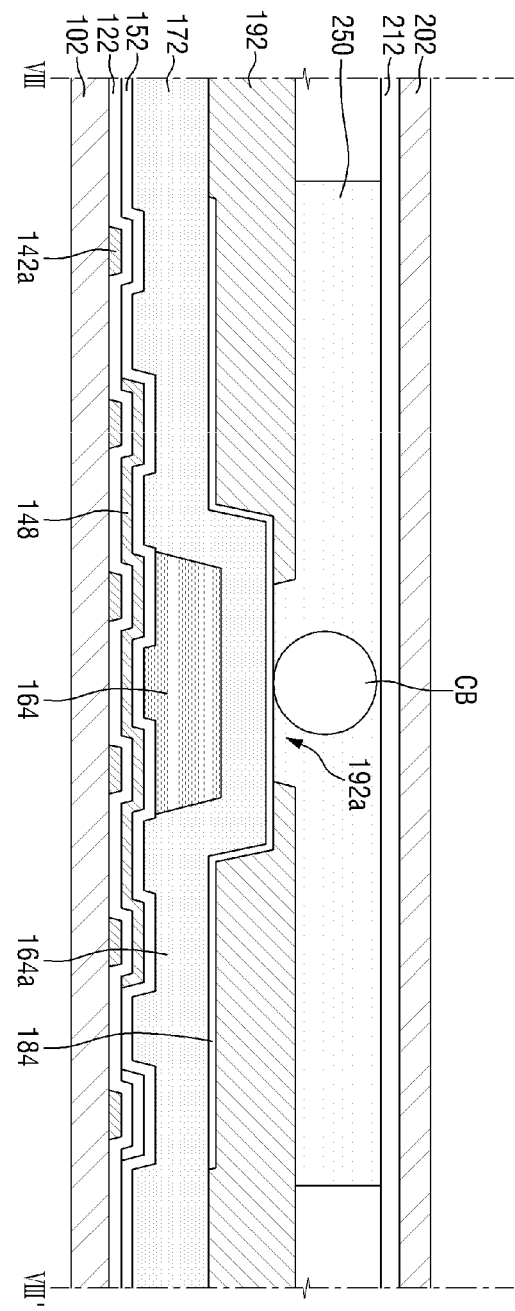
FIG. 8 is a cross-sectional view taken along the line VIII-VIII' of FIG. 7.

FIG. 1 is a schematic plan view of a display device 10 according to an embodiment of the present disclosure. FIG. 2 is an enlarged view of an area 'A' of FIG. 1. FIG. 3 is a cross-sectional view taken along the line III-III' of FIG. 2. FIG. 4 is a schematic plan view of a short point structure of the display device 10 of FIG. 1. FIG. 5 is an enlarged view of an area 'B' of FIG. 1. FIG. 6 is a cross-sectional view taken along the line VI-VI' of FIG. 5. FIG. 7 is an enlarged view of an area 'C' of FIG. 1. FIG. 8 is a cross-sectional view taken along the line VIII-VIII' of FIG. 7.

Referring to FIGS. 1 through 8, the display device 10 includes a first display substrate 100, a second display substrate 200 facing the first display substrate 100, and a liquid crystal layer 300 interposed between the first display substrate 100 and the second display substrate 200.

The display device 10 includes a display area DA and a non-display area NDA. A plurality of pixels arranged in a matrix may be defined in the display area DA.

A pixel electrode 182 may be disposed in each pixel of the display area DA of the first display substrate 100. The pixel electrode 182 may receive a data voltage through a thin-film transistor (TFT). A common electrode 212 may be formed on the whole surface of the display area DA as a single piece overlapping all the pixels and disposed on the second display substrate 200. The pixel electrode 182 may generate an electric field together with the common electrode 212, thereby controlling the alignment direction of the liquid crystal molecules of the liquid crystal layer 300 interposed between the pixel electrode 182 and the common electrode 212.

A data driver 400 that provides a data driving signal and a gate driver 500 that provides a gate driving signal may be disposed outside the display area DA of the first display substrate 100.

The data driver 400 may receive image signals and a data control signal from a timing controller (not illustrated). The data driver 400 may generate analog data voltages corresponding to the image signals in response to the data control signal. The data driver 400 may provide a data voltage to each pixel via a data transmission line 142a and a data line 142. The data transmission line 142a and the data line 142 may be electrically connected to each other.

The data driver 400 may include a plurality of data driver chips 410. The data driver chips 410 may be mounted on corresponding first flexible printed circuit boards (FPCBs) 420 and connected accordingly to a driver circuit board 430 and data pads (not illustrated) in the non-display area NDA. Although not illustrated in the drawings, the first FPCBs 420 on which the data driver chips 410 are mounted may be connected to corresponding data pads by anisotropic conductive films, respectively.

The gate driver 500 may generate gate signals in response to a gate control signal received from the timing controller (not illustrated) mounted on the driver circuit board 430. The gate signals may be provided to the pixels on a row-by-row basis and sequentially via gate lines 112. The gate driver 500 may be implemented integrally with the non-display area NDA using an amorphous silicon gate (ASG) method. However, this is merely an example, and the implementation method of the gate driver 500 is not limited to the ASG method. For example, the gate driver 500 may also be implemented using a tape carrier package (TCP) method in which a gate driver is mounted on an FPCB or a chip on glass (COG) method.

The first display substrate 100 and the second display substrate 200 may be bonded together by a sealing member 250 made of a sealant. The sealing member 250 may be placed in the non-display area NDA, that is, in a peripheral area of each of the first display substrate 100 and the second display substrate 200.

In some embodiments, the sealing member 250 disposed in the non-display area NDA may be shaped like a quadrilateral band, as illustrated in FIG. 4. However, this is merely an example, and the shape of the sealing member 250 is not limited to the quadrilateral band and may vary according to the structure of the display device 10.

In some embodiments, the sealing member 250 may include a conductive member. For example, the sealing member 250 may include a conductive ball CB, as illustrated in FIG. 6. A common voltage applied to a common voltage line (116, 184) may be provided to the common electrode 212 disposed on a second substrate 202 via the conductive member. In the embodiment of FIG. 6, the conductive ball CB is illustrated as an example of the conductive member. However, the present disclosure is not limited thereto, and the conductive member included in the sealing member 250 may have various cross-sectional shapes, such as oval and polygonal cross-sectional shapes.

The common voltage line (116, 184) may be disposed in the non-display area NDA. The common voltage line (116, 184) may be disposed on edges of a first substrate 102. The common voltage line (116, 184) may be disposed along the edges of the first substrate 102.

The common voltage line (116, 184) may include a first common voltage line 116 and a second common voltage line 184. The second common voltage line 184 may be disposed on the first common voltage line 116. The first common voltage line 116 and the second common voltage line 184 may be electrically connected to each other by apertures 116a formed in a gate insulating layer 122, a passivation layer 152 and an organic layer 172.

Specifically, the first common voltage line 116 may contact the second common voltage line 184 disposed in the apertures 116a, and the second common voltage line 184 exposed through an opening part (192a, 192b) of a light-blocking pattern 192 may contact the conductive ball CB. The conductive ball CB may contact the common electrode 212 disposed on the second substrate 202. Accordingly, the common voltage applied to the first common voltage line 116 may be provided to the common electrode 212 via the second common voltage line 184 and the conductive ball CB.

In some embodiments, the first common voltage line 116 may be disposed at the same level as gate wirings (112, 114), which is described later. The second common voltage line 184 may be disposed at the same level as the pixel electrode 182, which is described later. However, this is merely an example, and a structure for applying the common voltage to the common electrode 212 is not limited to the above structure.

The first common voltage line 116 may include a first common voltage line expansion portion 116E for improving the contact of the first common voltage line 116 with the second common voltage line 184. The width of the first common voltage line expansion portion 116E may be larger than the width of the entire first common voltage line 116 except for the first common voltage line expansion portion 116E.

In an exemplary embodiment, the first common voltage line expansion portion 116E may be disposed between a pair of adjacent fan-out parts FO. For convenience of description, the fan-out parts FO will be defined first. As already mentioned above, a plurality of data transmission lines 142a may extend from each of the data driving chips 410. The plurality of data transmission lines 142a, which are disposed in the non-display area NDA, may be connected to a plurality of data lines 142, which are disposed in the display area DA. A fan-out part FO may be defined by two outermost data transmission lines 142a of the plurality of data transmission lines 142a extending from each of the data driving chips 410. In other words, the fan-out part FO may be defined as an area between the two outermost data transmission lines 142a of the plurality of data transmission lines 142a extending from each of the data driving chips 410. As illustrated in FIG. 1, a plurality of fan-out parts FO may be provided.

FIG. 1 illustrates an example in which the fan-out parts FO are trapezoidal, but the present disclosure is not limited to this example. That is, the shape of the fan-out parts FO may vary as necessary.

FIG. 1 illustrates an example in which the first common voltage line expansion portion 116E is disposed adjacent to the data driver 400, but the location of the first common voltage line expansion portion 116E is not limited to this example. That is, the first common voltage line expansion portion 116E is for facilitating the contact between the first common voltage line 116 and the second common voltage line 184, and part of the first common voltage line 116 that is in contact with the second common voltage line 184 may be the first common voltage line expansion portion 116E. In other words, in another exemplary embodiment, the first common voltage line 116 and the second common voltage line 184 may contact each other anywhere in the non-display area NDA (that is, the first common voltage line 116 and the second common voltage line 184 are not particularly limited to contacting each other in an area adjacent to the fan-out parts FO, as illustrated in FIG. 1). Accordingly, part of the first common voltage line 116 that is in contact with the second common voltage line 184 may be replaced with the first common voltage line expansion portion 116E.

For consistency of description throughout the present disclosure, the first common voltage line 116 and the first common voltage line expansion portion 116E will hereinafter be collectively referred to as the first common voltage line 116. That is, in the description that follows, it is noted that part of the first common voltage line 116 that is in contact with the second common voltage line 184 may be replaced with the first common voltage line expansion portion 116E.

The first common voltage line 116 may contact the second common voltage line 184 through a plurality of apertures 116a. For example, referring to FIGS. 5 and 6, the apertures 116a may be disposed on a side of the opening part (192a) of the light-blocking pattern 192 and on the other side of the opening part (192a) (the opposite side from the above side). The common voltage may be applied to the second common voltage line 184 more effectively through a plurality of apertures 116a than through a single aperture. The structure of the apertures 116a illustrated in FIG. 5 is merely an example and is not limited to this example.

In FIG. 6, the conductive ball CB is disposed on the second common voltage line 184 exposed through the opening part (192a, 192b) of the light-blocking pattern 192. However, the present disclosure is not limited thereto, and the conductive ball CB may be distributed at various locations within the sealing member 250. In addition, the common voltage may be applied to the common electrode 212 through a means other than the conductive ball CB.

The opening part (192a, 192b) of the light-blocking pattern 192, that is, a short point structure, is described in detail later.

The liquid crystal layer 300 including liquid crystal molecules with positive dielectric anisotropy or negative dielectric anisotropy may be interposed between the first display substrate 100 and the second display substrate 200.

The structures of the first display substrate 100 and the second display substrate 200 of the display device 10 according to the current embodiment are now described in detail.

The first display substrate 100 uses the first substrate 102 as a base substrate. The first substrate 102 may contain an insulating material, such as transparent glass, quartz, ceramic, silicon or transparent plastic, or an appropriate material selected by those of ordinary skill in the art. In some embodiments, the first substrate 102 may have flexibility. That is, the first substrate 102 may be a deformable substrate that can be rolled, folded, bent, etc.

A plurality of gate wirings (112, 114) and a plurality of data wirings (142, 144, 146) may be disposed on the first substrate 102.

The gate wirings (112, 114) may include a plurality of gate lines 112 and a plurality of gate electrodes 114. The data wirings (142, 144 and 146) may include a plurality of data lines 142, a plurality of source electrodes 144, and a plurality of drain electrodes 146.

The gate wirings (112, 114) and the data wirings (142, 144, 146) may be made of aluminum (Al)-based metal, such as aluminum and an aluminum alloy, silver (Ag)-based metal, such as silver and a silver alloy, copper (Cu)-based metal such as copper and a copper alloy, molybdenum (Mo)-based metal such as molybdenum and a molybdenum alloy, chrome (Cr), titanium (Ti), or tantalum (Ta). In addition, the gate wirings (112, 114) and the data wirings (142, 144, 146) may have a multilayer structure composed of two conductive layers (not illustrated) with different physical characteristics. For example, one of the two conductive layers may be made of aluminum-based metal, silver-based metal or copper-based metal. The other one of the conductive layers may be made of molybdenum-based metal, chrome, titanium, or tantalum. Examples of the multilayer structure include a chrome lower layer and an aluminum upper layer and an aluminum lower layer and a molybdenum upper layer. However, the present disclosure is not limited thereto. The gate wirings (112, 114) and the data wirings (142, 144, 146) may be made of various metals and conductors.

The gate lines 112 may extend in a first direction, for example, in a horizontal direction along horizontal boundaries of the pixels. The data lines 142 may extend in a second direction, for example, in a vertical direction along vertical boundaries of the pixels. The gate lines 112 and the data lines 142 may perpendicularly intersect each other to define a plurality of pixel areas. That is, the pixel areas may be defined in areas surrounded by the gate lines 112 and the data lines 112.

At least one gate electrode 114 in each pixel is connected to each gate line 112. The gate electrode 114 may branch from the gate line 112 toward a semiconductor layer 132 or may be formed by extending the gate line 112. However, the present disclosure is not limited thereto, and the gate electrode 114 may also be defined in a region of the gate line 112 that overlaps the semiconductor layer 132.

At least one source electrode 144 in each pixel is connected to each data line 142. The source electrode 144 may branch from the data line 142 toward the semiconductor layer 132 or may be formed by extending the data line 142. However, the present disclosure is not limited thereto, and the source electrode 144 may also be defined in a region of the data line 142 that overlaps the semiconductor layer 132. For example, the source electrode 114 may not protrude from the data line 142 but may lie on substantially the same line as the data line 142. A drain electrode 146 may be separated from the source electrode 144 with respect to the semiconductor layer 132 and may be electrically connected to the pixel electrode 182 via a contact hole 146a that penetrates through the passivation layer 152 and the organic layer 172, which are described later.

The gate insulating layer 122 is disposed between the gate wirings (112, 114) and the data wirings (142, 144, 146). In an embodiment, the gate insulating layer 122 may be disposed on the gate wirings (112, 114), and the data wirings (142, 144, 146) may be disposed on the gate insulating layer 122. The gate insulating layer 122 may be made of, for example, silicon nitride (SiNx), silicon oxide (SiO$_2$), silicon oxynitride (SiON), or a stacked layer thereof. The gate insulating layer 122 may insulate the gate wirings (112, 114) from conductive thin layers (such as the data lines 142) located on the gate wrings (112, 114).

The semiconductor layer 132 is disposed on the gate insulating layer 122 and may be made of hydrogenated amorphous silicon, polycrystalline silicon or oxide semiconductor. At least part of the semiconductor layer 132 overlaps the gate electrode 114. The semiconductor layer 132 forms a TFT together with the gate electrode 114, the source electrode 144 and the drain electrode 146.

The semiconductor layer 132 may have various shapes, such as an island and a line. In the embodiment of FIG. 4, the semiconductor layer 132 is island-shaped. However, the shape of the semiconductor layer 132 is not limited to the island shape. The semiconductor layer 132 may also be shaped like a line. In this case, the semiconductor layer 132 may overlap the data wirings (142, 144, 146), although not illustrated in the drawings.

An ohmic contact layer 134 formed of n+ hydrogenated amorphous silicon heavily doped with n-type impurities may be disposed on the semiconductor layer 132. The ohmic contact layer 134 may be located between the semiconductor layer 132 thereunder and the source electrode 144 and the drain electrode 146 thereon to reduce contact resistance between them. Like the semiconductor layer 132, the ohmic contact layer 134 may have various shapes, such as an island and a line. When the semiconductor layer 132 is island-shaped, the ohmic contact layer 134 may also be island-shaped. When the semiconductor layer 132 is formed linearly, the ohmic contact layer 134 may also be formed linearly. Unlike the semiconductor layer 132, a region of the ohmic contact layer 134 that corresponds to a space by which the source electrode 144 and the drain electrode 146 are separated to face each other may be removed. As a result, the ohmic contact layer 134 may expose the semiconductor layer 132 disposed thereunder. A channel may be formed in a region of the semiconductor layer 132 that corresponds to the space by which the source electrode 144 and the drain electrode 146 are separated to face each other.

When a channel is formed in the semiconductor layer 132 in response to a gate-on signal transmitted to the gate electrode 114, the TFT is turned on. Then, the drain electrode 146 receives a data signal from the source electrode 144 and sends the received data signal to the pixel electrode 182.

The passivation layer 152 is disposed on the data wirings (142, 144, 146) and an exposed portion of the semiconductor layer 132. The contact hole 146*a* may be formed in the passivation layer 152 and the organic layer 172, which is described later, to expose at least a portion of the drain electrode 146. The at least a portion of the drain electrode 146 exposed by the contact hole 146*a* may contact the pixel electrode 182. Accordingly, the drain electrode 146 and the pixel electrode 182 may be electrically connected to/contact each other.

The passivation layer 152 may be made of an inorganic material, such as silicon nitride or silicon oxide, or a material such as a-Si:C:O or a-Si:O:F formed by plasma enhanced chemical vapor deposition (PECVD).

The organic layer 172 may be disposed on the passivation layer 152. The organic layer 172 may contain a material having superior planarization properties and photosensitivity. The organic layer 172 includes the contact hole 146*a* that exposes at least a portion of the drain electrode 146.

A color filter 162 may be disposed between the organic layer 172 and the passivation layer 152. The color filter 162 may include a red color filter, a green color filter, and a blue color filter. The red, green and blue color filters are formed in the pixels to form red, green and blue pixels, respectively. The color filter 162 may overlap the pixel electrode 182. The color filter 162 may contain a photosensitive organic material that contains a pigment. The organic layer 172 may be disposed on the color filter 162 to planarize steps between the red, green and blue color filters. The color filter 162 may be covered by the organic layer 172. That is, the color filter 162 may be completely covered by the organic layer. However, this is merely an example, and the present disclosure is not limited to this structure.

The pixel electrode 182 may be disposed on the organic layer 172 in each unit pixel. A portion of the pixel electrode 182 is disposed in the contact hole 146*a*. The portion of the pixel electrode 182 disposed in the contact hole 146*a* may contact the drain electrode 146 and thus be electrically connected to the drain electrode 146.

When a data voltage is applied to the pixel electrode 182 through the contact hole 146*a*, the pixel electrode 182 may generate an electric field together with the common electrode 212, thereby rotating liquid crystal molecules included in the liquid crystal layer 300. The pixel electrode 182 may be made of a transparent conductive material such as, but not limited to, indium tin oxide (ITO) or indium zinc oxide (IZO).

The light-blocking pattern 192 may be disposed on the organic layer 172 and the pixel electrode 182. The light-blocking pattern 192 prevents the leakage of light. The light-blocking pattern 192 may be disposed in a TFT area and a non-pixel area (between pixels, a gate line area and a data line area).

The light-blocking pattern 192 may be made of a black organic polymer material that contains black dye or pigment or a metal (metal oxide) such as chrome or chrome oxide.

A column spacer 194 is designed to maintain a gap between the first substrate 102 and the second substrate 202. In some embodiments, an end of the column spacer 194 may contact the second display substrate 200, as illustrated in FIG. 3. However, this is merely an example, and the end of the column spacer 194 may also be separated from the second display substrate 200 by a predetermined distance.

Although not illustrated in the drawings, the column spacer 194 may include a plurality of column spacers having different step heights. For example, the column spacer 194 may include a main column spacer having a higher step height and a sub-column spacer having a lower step height. In this case, the gap between the first display substrate 100 and the second display substrate 200 may be maintained against external pressure primarily by the main column spacer. When greater pressure is applied, the gap between the first display substrate 100 and the second display substrate 200 may be maintained secondarily by the sub-column spacer.

The column spacer 194 may be formed in an area corresponding to the TFT. At least part of the column spacer 194 may overlap the gate wirings (112, 114). However, this is merely an example, and the location of the column spacer 194 is not limited to the above example.

In some embodiments, the column spacer 194 may be made of the same material as the light-blocking pattern 192. The column spacer 194 and the light-blocking pattern 192 may be formed simultaneously in one patterning process through exposure using a halftone mask or a slit mask. That is, the column spacer 194 and the light-blocking pattern 192 may be formed simultaneously using the same material.

The second display substrate 200 uses the second substrate 202 as a base substrate. The second substrate 202 may be an insulating substrate. Specifically, like the first substrate 102, the second substrate 202 may contain an insulating material, such as transparent glass, quartz, ceramic, silicon or transparent plastic, or an appropriate material selected by those of ordinary skill in the art. In some embodiments, the second substrate 202 may have flexibility. That is, the second substrate 202 may be a deformable substrate that can be rolled, folded, bent, etc. The second substrate 202 may be placed to face the first substrate 102.

The common electrode 212 may be disposed on the second substrate 202. When the common voltage is received, the common electrode 212 may generate an electric field together with the pixel electrode 182, thereby controlling the alignment direction of the liquid crystal molecules included in the liquid crystal layer 300. The common voltage applied to the common voltage line (116, 184) may be provided to the common electrode 212 via the conductive ball CB.

The common electrode 212 may be formed as a single piece over the entire pixel areas surrounded by the gate lines 112 and the data lines 142. The common electrode 212 may be made of, but not limited to, a transparent conductive material, such as ITO or IZO.

Although not illustrated in the drawings, an alignment layer may be disposed on each of a surface of the first substrate 102 and a surface of the second substrate 202 facing the liquid crystal layer 300. The alignment layer for aligning the liquid crystal layer 300 may be disposed on the pixel electrode 182, the common electrode 212, the light-blocking pattern 192 and the column spacer 194. The alignment layer may contain a resin polymer, such as polyimide, polyamic acid, polyamide, polyamide-imide, polyester, polyethylene, polyurethane or polystyrene, or a mixture of the same. In addition, the alignment layer may contain monomers of the above resin polymer.

In some embodiments, although not illustrated in the drawings, a dam for preventing the flow of the alignment layer may be disposed on the surface of the first substrate 102 and the surface of the second substrate 202 facing the liquid crystal layer 300. The dam may be disposed further inwards of the first substrate 102 and the second substrate 202 than a short point at which the common voltage is applied to the common electrode 212.

The structure of the opening part (192a, 192b) of the light-blocking pattern 192, that is, the structure of a short point is now described in detail.

The display device 10 according to the current embodiment may apply the common voltage to the common electrode 212 disposed on the second substrate 202 through the conductive ball CB included in the sealing member 250. Accordingly, a point, i.e., a short point at which the common voltage is applied to the common electrode 212 may be formed inside the sealing member 250. The short point may be formed substantially in the opening part (192a, 192b) of the light-blocking pattern 192 due to the structure described below.

Specifically, referring to FIG. 4, the opening part (192a, 192b) of the light-blocking pattern 192, a dummy color layer (164a, 164b), and the second common voltage line 184 may be disposed in areas overlapped by areas inside the sealing member 250. In other words, at least part of the sealing member 250 may completely overlap the opening part (192a, 192b) of the light-blocking pattern 192, the dummy color layer (164a, 164b), and the second common voltage line 184. In addition, the opening part (192a, 192b) may completely overlap the dummy color layer (164a, 164b) and the second common voltage line 184.

Referring to FIG. 6, the second common voltage line 184 may be disposed on the dummy color layer (164a, 164b), and the opening part (192a, 192b) of the light-blocking pattern 192 may be formed on the second common voltage line 184. However, this is merely an example, and the location of the opening part (192a, 192b) of the light-blocking pattern 192, the dummy color layer (164a, 164b) and the second common voltage line 184 are not limited to the above example.

The light-blocking pattern 192 includes the opening part (192a, 192b) for applying the common voltage to the common electrode 212 disposed on the second substrate 202. The opening part (192a, 192b) may extend in a direction, for example, in the horizontal direction, as illustrated in FIG. 4. At least a portion of the second common voltage line 184 may be exposed by the opening part (192a, 192b), and at least part of the exposed portion of the second common voltage line 184 may contact the conductive ball CB. Accordingly, a short point may be formed substantially within the opening part (192a, 192b) of the light-blocking pattern 192.

The opening part (192a, 192b) of the light-blocking pattern 192 may be formed in the non-display area NDA. The opening part (192a, 192b) may be formed inside the light-blocking pattern 192. More specifically, the opening part (192a, 192b) may be formed inside the light-blocking pattern 192 disposed in the non-display area NDA. When seen from above, the opening part (192a, 192b) may be rectangular but are not limited thereto.

In some embodiments, the opening part (192a, 192b) of the light-blocking pattern 192 may include a first opening 192a and a second opening 192b. Referring to FIGS. 1 and 4, the first opening 192a may be formed on the side of the display substrate on which the data driver 400 is disposed (on the upper side of the drawings), and the second opening 192b may be formed on the opposite side from the data driver 400 (on the lower side of the drawings). Here, the display area DA may be interposed between the first opening 192a and the second opening 192b.

The first opening 192a may be implemented in the shape of a line traversing the fan-out parts FO. In other words, the first opening 192a may extend in the first direction (e.g., the horizontal direction in FIG. 4). That is, at least part of the first opening 192a may overlap the fan-out parts FO.

The second opening 192b may be implemented on the opposite side from the data driver 400 in substantially the same shape as the first opening 192a. That is, the second opening 192b may extend in the first direction (e.g., the horizontal direction in FIG. 4).

In some embodiments, as apparent from FIG. 4, a length of each of the first opening 192a and the second opening 192b may be greater than a width (a horizontal width in the drawing) of the display area DA due to the nature of a manufacturing method that is described later.

In some embodiments, when the display area DA is rectangular or roughly rectangular, the first opening 192a and the second opening 192b may be disposed on long sides of the display area DA, respectively. Accordingly, the common voltage may be evenly applied to the whole of the common electrode 212.

The dummy color layer (164a, 164b) may be disposed at a location corresponding to the opening part (192a, 192b) of the light-blocking pattern 192. The dummy color layer (164a, 164b) may be disposed under the opening part (192a, 192b). The dummy color layer (164a, 164b) may be at least partially overlapped by the opening part (192a, 192b). The dummy color layer (164a, 164b) may extend in a direction, for example, in the horizontal direction, as illustrated in FIG. 4. When seen from above, the dummy color layer (164a, 164b) may be rectangular but are not limited thereto.

In some embodiments, the dummy color layer (164a, 164b) may include a first dummy color layer 164a and a second dummy color layer 164b. Referring to FIGS. 1 through 4, the first dummy color layer 164a may be formed on the side of display substrate on which the data driver 400 is displayed (on the upper side of the drawings), and the second dummy color layer 164b may be formed on the opposite side from the data driver 400 (on the lower side of the drawings). Here, the display area DA may be interposed between the first dummy color layer 164a and the second dummy color layer 164b.

The first dummy color layer 164a may be implemented in the shape of a line traversing the fan-out parts FO. In other words, the first dummy color layer 164a may extend in the first direction (e.g., the horizontal direction in FIG. 4). That is, at least part of the first dummy color layer 164a may overlap the fan-out parts FO.

The second dummy color layer 164b may be implemented on the opposite side from the data driver 400 in substantially the same shape as the first dummy color layer 164a. That is, the second dummy color layer 164b may extend in the first direction (e.g., the horizontal direction in FIG. 4).

In some embodiments, as apparent from FIG. 4, a length of each of the first dummy color layer 164a and the second dummy color layer 164b may be greater than the width (the horizontal width in the drawing) of the display area DA due to the nature of a manufacturing method that is described later.

In some embodiments, the width of the dummy color layer (164a, 164b) may be greater than that of the opening part (192a, 192b), as illustrated in FIGS. 4 and 5. However, the present disclosure is not limited to this structure, and the width of the dummy color layer (164a, 164b) may also be equal to that of the opening part (192a, 192b). Here, the width refers to a vertical length in FIG. 5.

The dummy color layer (164a, 164b) may be disposed under the light-blocking pattern 192 to secure steps that provide contact between the conductive ball CB and the common electrode 212 and prevent the leakage of light through the opening part (192a, 192b).

In some embodiments, the dummy color layer (164a, 164b) may be disposed at the same level as the color filter 162. That is, the dummy color layer (164a, 164b) may be disposed on the passivation layer 152. The dummy color layer (164a, 164b) may contain a photosensitive organic material that contains a pigment. For example, the dummy color layer (164a, 164b) may contain the same material as the blue color filter. That is, the dummy color layer (164a, 164b) may be blue. However, this is merely an example, and the disposition and material of the dummy color layer (164a, 164b) are not limited to the above example.

At least part of the second common voltage line 184 may be exposed by the opening part (192a, 192b) of the light-blocking pattern 192. The second common voltage line 184 may be disposed at a location corresponding to the opening part (192a, 192b). The second common voltage line 184 may be disposed on the side of the display substrate on which data driver 400 is disposed (on the upper side of the drawings) and on the opposite side from the data driver 400 (on the lower side of the drawings) with the display area DA interposed therebetween.

The second common voltage line 184 may be implemented in the shape of a line traversing the fan-out parts FO. In other words, the second common voltage line 184 may extend in the first direction (e.g., the horizontal direction in FIG. 4). That is, at least part of the second common voltage line 184 may overlap the fan-out parts FO.

In some embodiments, as apparent from FIG. 4, a length of the second common voltage line 184 may be greater than the width (the horizontal width in the drawing) of the display area DA due to the nature of a manufacturing method that is described later.

In some embodiments, the width of the second common voltage line 184 may be greater than those of the opening part (192a, 192b) and the dummy color layer (164a, 164b), as illustrated in FIGS. 4 and 5. The opening part (192a, 192b) may completely overlap the second common voltage line 184. However, this is merely an example, and the present disclosure is not limited to this structure. The width of the dummy color layer (164a, 164b) may be equal to that of the opening part (192a, 192b). Here, the width refers to the vertical length in FIG. 5.

In the case of a large-sized panel, the light-blocking pattern 192 and the dummy color layer (164a, 164b) may generally be manufactured using a stitch-shot method. When manufactured using this method, the light-blocking pattern 192 and the dummy color layer (164a, 164b) may have different stitch-shot configurations, and the opening part (192a, 192b) of the light-blocking pattern 192 may be misaligned (in particular, in the horizontal or vertical direction of the drawings) with the dummy color layer (164a and 164b). Accordingly, light reflected by an exposed metal thereunder, e.g., the first common voltage line 116, may be seen.

In this regard, in the display device 10 according to the current embodiment, the opening part (192a, 192b) and the dummy color layer (164a, 164b) may be implemented in the shape of lines, as illustrated in FIG. 4, such that the opening part (192a, 192b) of the light-blocking pattern 192 is not misaligned with the dummy color layer (164a, 164b). That is, each of the opening part (192a, 192b) and the dummy color layer (164a, 164b) may be implemented not as an intermittently broken line but as one continuous line. Therefore, even if the light-blocking pattern 192 and the dummy color layer (164a, 164b) are manufactured using the stitch-shot method, it is possible to prevent the generation of reflected light by the metal thereunder due to the misalignment of the light-blocking pattern 192 with the dummy color layer (164a, 164b).

On the other hand, the line-shaped first opening 192a of the light-blocking pattern 192 may overlap the fan-out parts FO in which the data transmission lines 142a extend from the data driver 400. Here, the first common voltage line 116 may be disposed under the first opening 192a around each of the fan-out parts FO, as illustrated in FIG. 6, thereby preventing the leakage of light. However, each of the fan-out parts FO may include the data transmission lines 142a implemented in a zigzag shape for the uniformity of voltage drop, as illustrated in FIG. 7. In this case, light may leak between portions of each of the data transmission lines 142a.

In this regard, the display device 10 according to the current embodiment may include alight-blocking metal layer 148 to prevent the leakage of light in each of the fan-out parts FO.

In some embodiments, the light-blocking metal layer 148 may be selectively disposed in each of the fan-out parts FO, as illustrated in FIG. 1. At least part of the light-blocking metal layer 148 may overlap each of the first common voltage line 116, as illustrated in FIG. 1. At least part of the light-blocking metal layer 148 may overlap the data transmission lines 142a and the dummy color layer (164a, 164b), as illustrated in FIGS. 7 and 8. That is, at least one of the first common voltage line 116 and the light-blocking metal layer 148 may be disposed under the first opening 192a of the light-blocking pattern 192. Accordingly, the leakage of light through the first opening 192a of the light-blocking pattern 192 is prevented by at least one of the first common voltage line 116 and the light-blocking metal layer 148.

In some embodiments, a width of the light-blocking metal layer 148 may be greater than the width of the first opening 192a of the light-blocking pattern 192 and the width of the dummy color layer (164a, 164b), as illustrated in FIG. 7. However, this is merely an example, and the width of the light-blocking metal layer 148 may be smaller than or equal to the width of the dummy color layer (164a, 164b) and greater than the width of the first opening 192a. In addition, the width of the light-blocking metal layer 148 may be smaller than that of the sealing member 250, as illustrated in FIG. 8. However, this is merely an example, and the width of the light-blocking metal layer 148 may be greater than or equal to that of the sealing member 250 and greater than the width of the first opening 192a. Here, the width refers to a vertical length in FIG. 7 or a horizontal length in FIG. 8.

In the embodiment of FIG. 6, the dummy color layer (164a, 164b) is implemented as a single layer. However, the present disclosure is not limited thereto, and the dummy color layer (164a, 164b) may include multiple layers.

Figure 9:
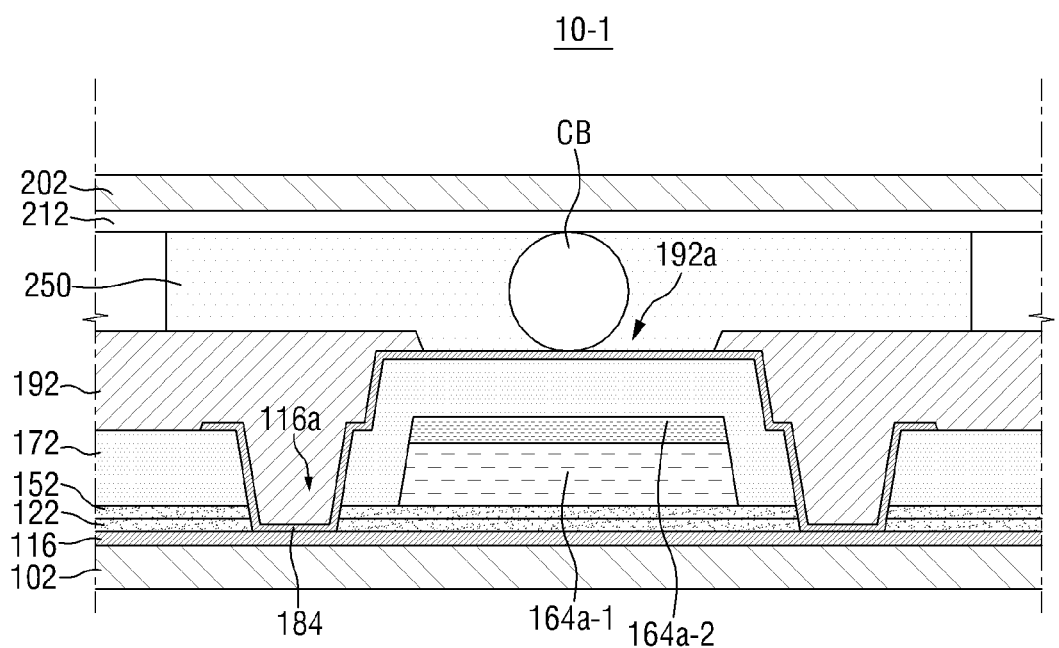
FIG. 9 is a cross-sectional view of a display device according to another embodiment of the present disclosure, taken along a line corresponding to the line VI-VI' of FIG. 5.

FIG. 9 is a cross-sectional view of a display device 10-1 according to another embodiment of the present disclosure, taken along a line corresponding to the line VI-VI' of FIG. 5.

Referring to FIG. 9, the display device 10-1 according to the current embodiment is identical or similar to the display device 10 described above with reference to FIGS. 1 through 8 except for a dummy color layer (164a-1, 164a-2). For simplicity, the display device 10-1 according to the current embodiment is hereinafter described to an extent focusing mainly on differences with the display device 10 described above with reference to FIGS. 1 through 8.

In the current embodiment, the dummy color layer (164a-1, 164a-2) includes a first dummy color layer 164a-1 and a second dummy color layer 164a-2 stacked sequentially. The second dummy color layer 164a-2 may be disposed on the first dummy color layer 164a-1. The first dummy color layer 164a-1 and the second dummy color layer 164a-2 may overlap each other. The first dummy color layer 164a-1 and the second dummy color layer 164a-2 may include a contact surface therebetween. However, the present disclosure is not limited thereto, and another layer may be interposed between the first dummy color layer 164a-1 and the second dummy color layer 164a-2.

The dummy color layer (164a-1, 164a-2) may contain a photosensitive organic material that contains a pigment. For example, the first and second dummy color layers 164a-1 and 164a-2 may contain the same material as any one of a red color filter, a green color filter, and a blue color filter. The first dummy color layer 164a-1 and the second dummy color layer 164a-2 may also contain photosensitive organic materials that contain pigments of different colors. For example, the first dummy color layer 164a-1 may contain the same material as the red color filter, and the second dummy color layer 164a-2 may contain the same material as the blue color filter. That is, the first dummy color layer 164a-1 may be blue, and the second dummy color layer 164a-2 may be red. However, this is merely an example, and the colors of the first and second dummy color layers 164a-1 and 164a-2 are not limited to the above example.

The first and second dummy color layers 164a-1 and 164a-2 may be disposed under a light-blocking pattern 192 to prevent the leakage of light through an opening part (192a). The prevention of the leakage of light by the first dummy color layer 164a-1 is reinforced by the second dummy color layer 164a-2.

In the embodiment of FIG. 6, an organic layer 172 is provided. However, the present disclosure is not limited thereto, and the organic layer 172 may be omitted.

Figure 10:
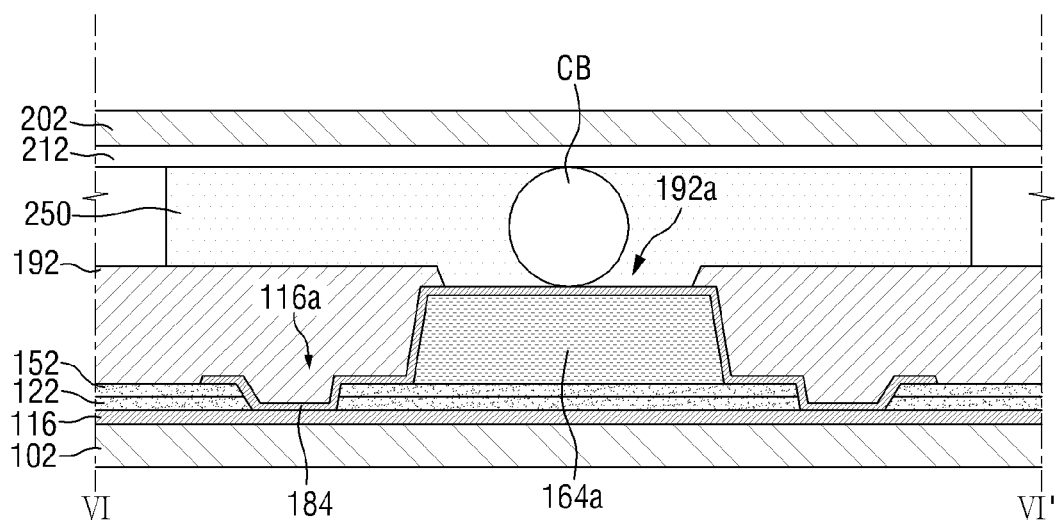
FIGS. 10 and 11 are cross-sectional views of display devices according to other embodiments of the present disclosure, taken along a line corresponding to the line VI-VI' of FIG. 5.
Figure 11:
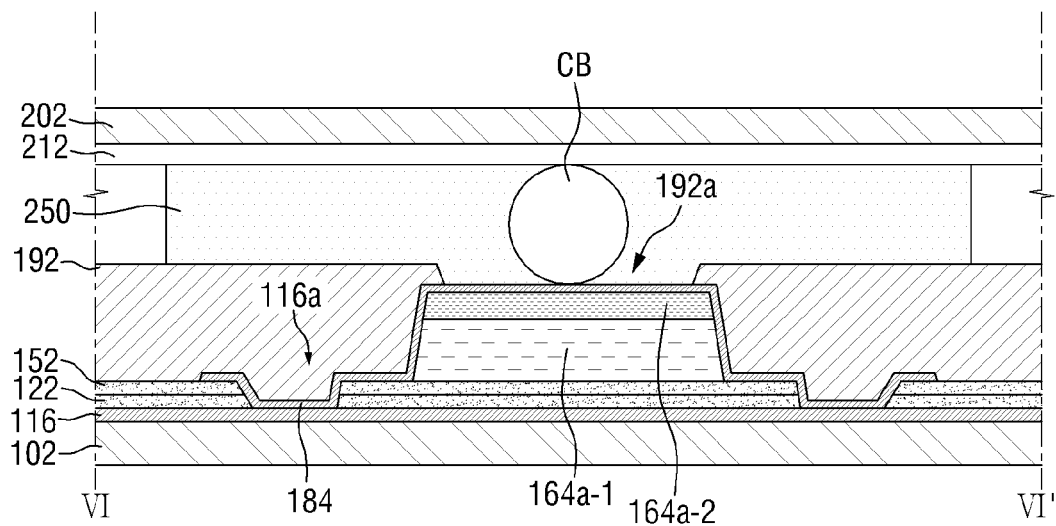

FIGS. 10 and 11 are cross-sectional views of display devices 10-2 and 10-3 according to other embodiments of the present disclosure, taken along a line corresponding to the line VI-VI' of FIG. 5.

First, referring to FIG. 10, the display device 10-2 according to the current embodiment is identical or similar to the display device 10 described above with reference to FIGS. 1 through 8 except that it does not include an organic layer. For simplicity, the display device 10-2 according to the current embodiment is hereinafter described to an extent focusing mainly on differences with the display device 10 described above with reference to FIGS. 1 through 8.

Unlike the display device 10 described above with reference to FIGS. 1 through 8, the display device 10-2 according to the current embodiment does not include an organic layer. Therefore, a second common voltage line 184 may be disposed directly on a passivation layer 152. In addition, the second common voltage line 184 may be disposed directly on a dummy color layer 164a.

Next, referring to FIG. 11, the display device 10-3 according to the current embodiment is identical or similar to the display device 10 described above with reference to FIGS. 1 through 8 except for a dummy color layer (164a-1, 164a-2). For simplicity, the display device 10-3 according to the current embodiment is hereinafter described to an extent focusing mainly on differences with the display device 10 described above with reference to FIGS. 1 through 8.

In the current embodiment, the dummy color layer (164a-1, 164a-2) includes a first dummy color layer 164a-1 and a second dummy color layer 164a-2 stacked sequentially. The second dummy color layer 164a-2 may be disposed on the first dummy color layer 164a-1. The first dummy color layer 164a-1 and the second dummy color layer 164a-2 may overlap each other. The first dummy color layer 164a-1 and the second dummy color layer 164a-2 may include a contact surface therebetween. However, the present disclosure is not limited thereto, and another layer may be interposed between the first dummy color layer 164a-1 and the second dummy color layer 164a-2.

The dummy color layer (164a-1, 164a-2) may contain a photosensitive organic material that contains a pigment. For example, the first and second dummy color layers 164a-1 and 164a-2 may contain the same material as any one of a red color filter, a green color filter, and a blue color filter. The first dummy color layer 164a-1 and the second dummy color layer 164a-2 may also contain photosensitive organic materials that contain pigments of different colors. For example, the first dummy color layer 164a-1 may contain the same material as the red color filter, and the second dummy color layer 164a-2 may contain the same material as the blue color filter. That is, the first dummy color layer 164a-1 may be blue, and the second dummy color layer 164a-2 may be red. However, this is merely an example, and the colors of the first and second dummy color layers 164a-1 and 164a-2 are not limited to the above example.

The dummy color layer (164a-1, 164a-2) may be disposed under a light-blocking pattern 192 to prevent the leakage of light through an opening part (192a). The prevention of the leakage of light by the first dummy color layer 164a-1 is reinforced by the second dummy color layer 164a-2.

In some embodiments, the opening part (192a, 192b) of the light-blocking pattern 192 may be implemented in a closed form, as illustrated in FIG. 4. However, this is merely an example, and the opening part (192a, 192b) of the light-blocking pattern 192 may also be implemented in an open form.

Figure 12:
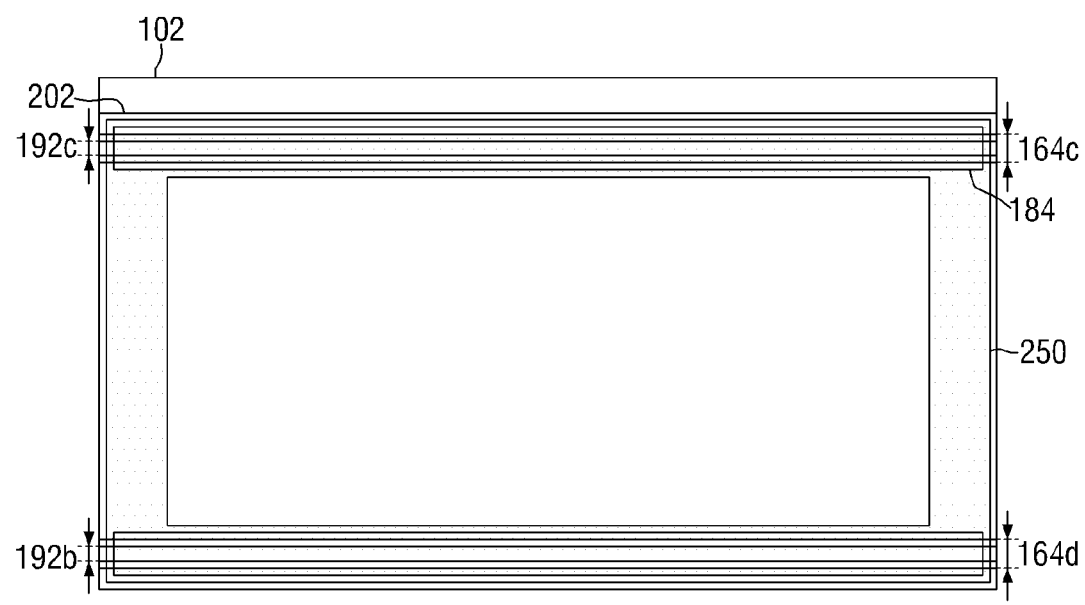
FIGS. 12 and 13 illustrate short points of display devices according to other embodiments of the present disclosure.

FIG. 12 illustrates a short point of a display device 10-4 according to another embodiment of the present disclosure.

Referring to FIG. 12, the display device 10-4 according to the current embodiment is identical or similar to the display device 10 described above with reference to FIGS. 1 through 8 except for an opening part (192c, 192d) and a dummy color layer (164*c*, 164*d*). For simplicity, the display device 10-2 according to the current embodiment is hereinafter described to an extent focusing mainly on differences with the display device 10 described above with reference to FIGS. 1 through 8.

In the current embodiment, the opening part (192*c*, 192*d*) of a light-blocking pattern 192 includes a first opening 192*c* formed on the side of the display substrate on which the data driver 400 is disposed (on an upper side of the drawing) and a second opening 192*d* formed on the opposite side from the data driver 400 (on a lower side of the drawing). Here, a display area DA may be interposed between the first opening 192*c* and the second opening 192*d*. As illustrated in FIG. 12, both ends of each of the first opening 192*c* and the second opening 192*d* may be open. Accordingly, a light-blocking pattern 192 may be separated by each of the first opening 192*c* and the second opening 192*d*.

In the current embodiment, the dummy color layer (164*c*, 164*d*) includes a first dummy color layer 164*c* that is formed on the side of the display substrate on which the data driver 400 is disposed (on the upper side of the drawing) and a second dummy color layer 164*d* formed on the opposite side from the data driver 400 (on the lower side of the drawing). Here, the display area DA may be interposed between the first dummy color layer 164*c* and the second dummy color layer 164*d*. As illustrated in FIG. 12, both ends of each of the first dummy color layer 164*c* and the second dummy color layer 164*d* may extend up to left and right boundaries of a first substrate 102.

In some embodiments, the opening part (192*a* and 192*b*) of the light-blocking pattern 192 may be separated, as illustrated in FIG. 4. However, this is merely an example, and the opening part (192*c* and 192*d*) of the light-blocking pattern 192 may also be formed as a single piece.

Figure 13:

FIG. 13 illustrates a short point of a display device 10-5 according to another embodiment of the present disclosure.

Referring to FIG. 13, the display device 10-5 according to the current embodiment is identical or similar to the display device 10 described above with reference to FIGS. 1 through 8 except for an opening part 192*e* of a light-blocking pattern 192, a dummy color layer 164*e*, and a second common voltage line 184*e*. For simplicity, the display device 10-5 according to the current embodiment is hereinafter described to an extent focusing mainly on differences with the display device 10 described above with reference to FIGS. 1 through 8.

In the current embodiment, the opening part 192*e* of the light-blocking pattern 192 may be formed as a single piece along an outer circumference of a display area DA. When seen from above, the opening part 192*e* may be shaped like a quadrilateral band, as illustrated in FIG. 13. However, this is merely an example, and the shape of the opening part 192*e* is not limited to the quadrilateral band.

In the current embodiment, the dummy color layer 164*e* may be formed as a single piece along the outer circumference of the display area DA. When seen from above, the dummy color layer 164*e* may be shaped like a quadrilateral band, as illustrated in FIG. 13. The dummy color layer 164*e* may be wider than the opening part 192*e*. The opening 192*e* may be disposed inside the dummy color layer 164*e*. At least part of the dummy color layer 164*e* may overlap the opening part 192*e*. However, this is merely an example, and the shape of the dummy color layer 164*e* is not limited to this example.

In the current embodiment, the second common voltage line 184*e* may be formed as a single piece along the outer circumference of the display area DA. When seen from above, the second common voltage line 184*e* may be shaped like a quadrilateral band, as illustrated in FIG. 13. The second common voltage line 184*e* may be wider than the dummy color layer 164*e* and the opening part 192*e*. The dummy color layer 164*e* and the opening part 192*e* may be disposed inside the second common voltage line 184*e*. At least part of the second common voltage line 184*e* may overlap the dummy color layer 164*e* and the opening 192*e*. However, this is merely an example, and the shape of the second common voltage line 184*e* is not limited to this example.

In some embodiments, a light-blocking metal layer 148 may be selectively disposed in each fan-out part FO, as illustrated in FIG. 1. However, this is merely an example, and the light-blocking metal layer 148 may also be formed as a single piece extending across the fan-out parts FO.

Figure 14:
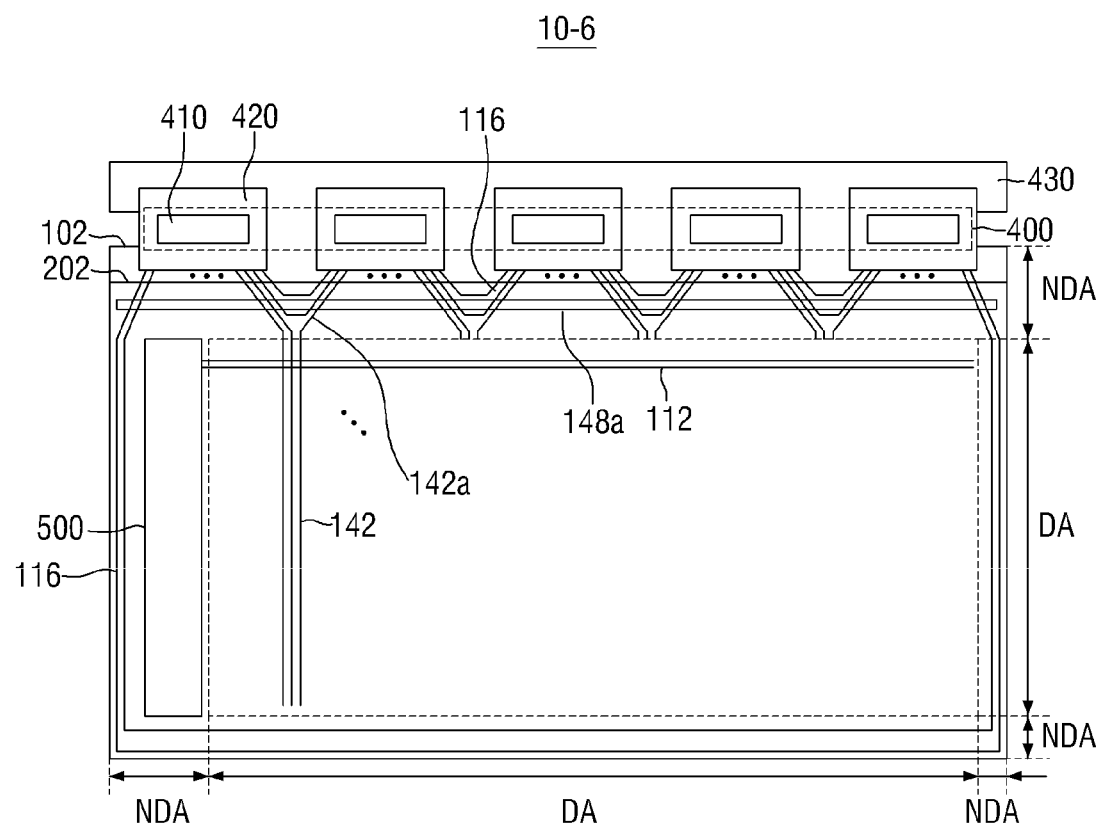
FIG. 14 is a schematic plan view of a display device according to another embodiment of the present disclosure.
Figure 15:
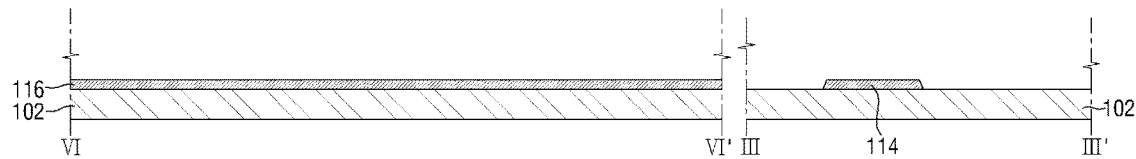
FIGS. 15, 16, 17, 18, 19, 20, 21, 22, 23, 24, 25 and 26 are cross-sectional views illustrating steps of a method of manufacturing a display device according to an embodiment of the present disclosure.

FIG. 14 is a schematic plan view of a display device 10-6 according to another embodiment of the present disclosure.

Referring to FIG. 14, the display device 10-6 according to the current embodiment is identical or similar to the display device 10 described above with reference to FIGS. 1 through 8 except for a light-blocking metal layer 148*a*. For simplicity, the display device 10-6 according to the current embodiment is hereinafter described to an extent focusing mainly on differences with the display device 10 described above with reference to FIGS. 1 through 8.

In the current embodiment, the light-blocking metal layer 148*a* may be formed as a single piece extending across fan-out parts FO. At least part of the light-blocking metal layer 148*a* may overlap a first common voltage line 116, as illustrated in FIG. 14. Although not illustrated in the drawing, at least part of the light-blocking metal layer 148*a* may overlap data transmission lines 142*a* and a dummy color layer 164. The light-blocking metal layer 148*a* may be disposed under a first opening 192*a* of a light-blocking pattern 192. In other words, at least part of the light-blocking metal layer 148*a* may be overlapped by the first opening 192*a* of the light-blocking pattern 192. Accordingly, the leakage of light through the first opening 192*a* of the light-blocking pattern 192 may be prevented by the light-blocking metal layer 148*a*.

In some embodiments, a width of the light-blocking metal layer 148*a* may be greater than a width of the first opening 192*a* of the light-blocking pattern 192 and a width of the dummy color layer 164. However, this is merely an example, and the width of the light-blocking metal layer 148*a* may be smaller than or equal to the width of the dummy color layer 164 and greater than the width of the first opening 192*a*. In addition, the width of the light-blocking metal layer 148*a* may be smaller than that of a sealing member 250. However, this is merely an example, and the width of the light-blocking metal layer 148*a* may be greater than or equal to that of the sealing member 250 and greater than the width of the first opening 192*a*.

Hereinafter, a method of manufacturing the display device 10 according to the embodiments of FIGS. 1 through 8 is described.

FIGS. 15 through 26 are cross-sectional views illustrating steps of a method of manufacturing a display device according to an embodiment of the present disclosure.

Referring to FIGS. 2, 3, 6, 8 and 15, a gate wiring (112, 114) is formed on a first substrate 102.

A first metal layer (not illustrated) is formed on the first substrate 102 that contains a transparent material, such as glass or quartz. The first metal layer (not illustrated) may be made of aluminum, copper, silver, molybdenum, chrome, titanium, tantalum, or an alloy of the same. In addition, the gate wiring (112, 114) may include two or more layers with different physical characteristics. The first metal layer (not illustrated) is deposited by, for example, a sputtering process. Then, the first metal layer (not illustrated) is patterned by a photolithography process using an exposure mask, thereby forming the gate wiring (112, 114) that includes a gate line 112 and a gate electrode 114. The gate electrode 114 may be shaped like a protrusion branching from the gate line 112.

In some embodiments, a first common voltage line 116 may be formed in the same process as the gate wiring (112, 114). In this case, the first common voltage line 116 may be formed at the same level as the gate wiring (112, 114) using the same material. However, this is merely an example, and the first common voltage line 116 may be formed at a different time as when the gate wiring (112, 114) is formed. In addition, the first common voltage line 116 may be formed at a different level as that of the gate wiring (112, 114).

In some embodiments, a data transmission line 142a may be formed in the same process as the gate wiring (112, 114). In this case, the data transmission line 142a may be formed at the same level as the gate wiring (112, 114) using the same material. However, this is merely an example, and the data transmission line 142a may be formed at a different time as when the gate wiring (112, 114) is formed. In addition, the data transmission line 142a may be formed at a different level as that of the gate wiring (112, 114).

Figure 16:
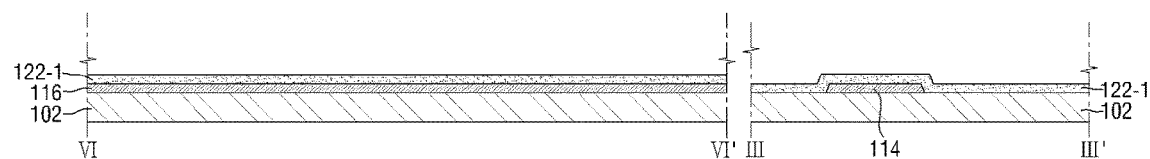

Referring to FIG. 16, a gate insulating layer 122-1 is formed on the gate wiring (112, 114). The gate insulating layer 122-1 may be formed by PECVD and contain silicon nitride ($SiN_x$) or silicon oxide ($SiO_2$).

Figure 17:
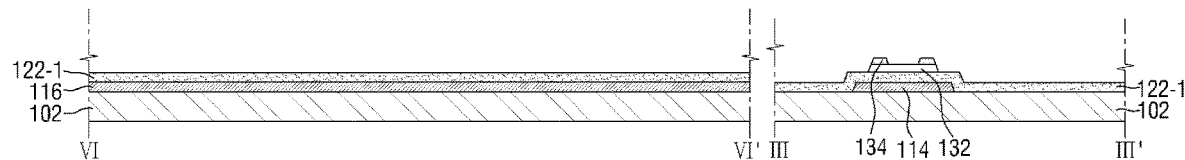

Referring to FIG. 17, a semiconductor layer 132 and an ohmic contact layer 134 are formed on the gate insulating layer 122-1. The semiconductor layer 132 may be formed using hydrogenated amorphous silicon or polycrystalline silicon. The semiconductor layer 132 and the ohmic contact layer 134 may be formed by a photolithography process.

Figure 18:
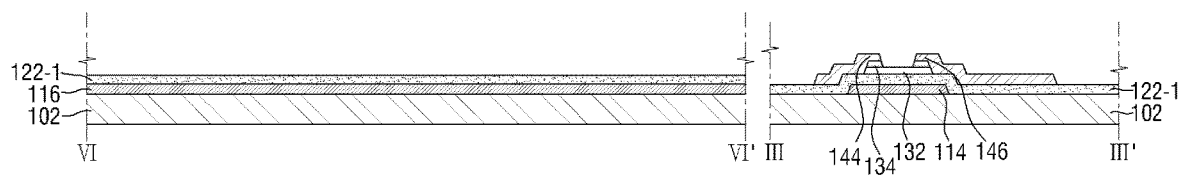

Referring to FIG. 18, a data wiring (142, 144, 146) including a data line 142 that intersects the gate line 112 to define a unit pixel and a source electrode 144 and a drain electrode 146 is formed on the gate insulating layer 122-1, the semiconductor layer 132 and the ohmic contact layer 134. Like the gate wiring (112, 114), the data wiring (142, 144, 146) may be made of aluminum, copper, silver, molybdenum, chrome, titanium, tantalum, or an alloy of the same. In addition, the data wiring (142, 144, 146) may include two or more layers with different physical characteristics.

Referring to FIG. 8, in some embodiments, a light-blocking metal layer 148 may be formed in the same process as the data wiring (142, 144, 146). In this case, the light-blocking metal layer 148 may be formed at the same level as the data wiring (142, 144, 146) using the same material. However, this is merely an example, and the light-blocking metal layer 148 may be formed at a different time as when the data wiring (142, 144, 146) is formed. In addition, the light-blocking metal layer 148 may be formed at a different level as that of the data wiring (142, 144, 146).

Figure 19:
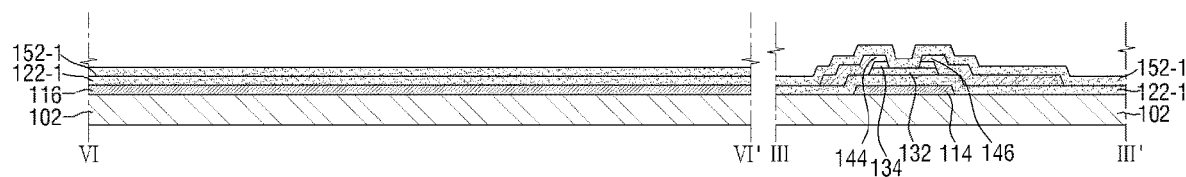

Referring to FIG. 19, a passivation layer 152-1 is formed on the first substrate 102 having a TFT. The passivation layer 152-1 may be made of an inorganic material, such as silicon nitride or silicon oxide, or a material such as a-Si:C:O or a-Si:O:F formed by PECVD.

Figure 20:
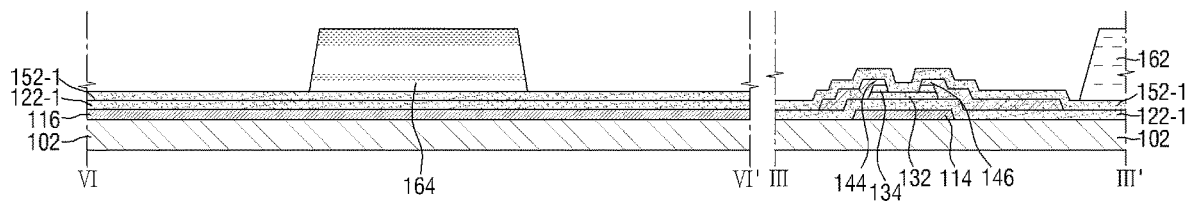

Referring to FIG. 20, a color filter 162 is formed on the passivation layer 152-1. The color filter 162 may be disposed in a pixel area and include a red color filter, a green color filter and a blue color filter. The color filter 162 may be made of a photosensitive organic material that contains a pigment. The color filter 162 may be formed by a photolithography process or an inkjet printing method. The color filter 162 may also be formed using various other methods.

In some embodiments, a dummy color layer (164a, 164b) may be formed in the same process as the color filter 162. In this case, the dummy color layer (164a, 164b) may be formed at the same level as the color filter 162. The dummy color layer (164a, 164b) may contain a photosensitive organic material that contains a pigment. For example, the dummy color layer (164a, 164b) may contain the same material as the blue color filter. More specifically, the method of manufacturing a display device according to the current embodiment may include forming a red color filter layer and a blue color filter layer, and the blue color filter layer and the dummy color layer (164a, 164b) may be formed in the same process using the same material. However, this is merely an example, and the material of the dummy color layer (164a, 164b) is not limited to the above example.

In some embodiments, the dummy color layer (164a, 164b) may include multiple layers. For example, referring to FIG. 9, the dummy color layer (164a, 164b) may include a first dummy color layer and a second dummy color layer. The first dummy color layer and the second dummy color layer may be made of photosensitive organic materials that contain pigments of different colors. The first dummy color layer may be made of the same material as the red color filter, and the second dummy color layer may be made of the same material as the blue color filter. However, this is merely an example, and the colors of the first dummy color layer and the second dummy color layer are not limited to the above example.

In some embodiments, the dummy color layer (164a, 164b) and the color filter 162 may be manufactured using a stitch-shot method. In this case, a stitch shot that forms the dummy color layer (164a, 164b) and the color filter 162 disposed at left and right ends of a display panel may be different from a stitch shot that forms the dummy color layer (164a, 164b) and the color filter 162 disposed in a central part of the display panel excluding the left and right ends thereof. The stitch shot that forms the dummy color layer (164a, 164b) and the color filter 162 disposed in the central part of the display panel may be used successively and repeatedly. However, this is merely an example, and a method of manufacturing the dummy color layer (164a, 164b) and the color filter 162 is not limited to this example.

Figure 21:
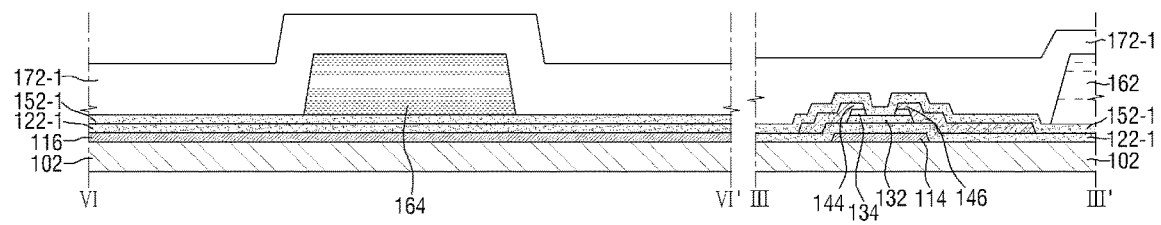

Referring to FIG. 21, an organic layer 172-1 is formed on the passivation layer 152-1 and the color filter 162. The organic layer 172-1 may contain a material having superior planarization properties and photosensitivity. The organic layer 172-1 may be formed by spin coating or slit coating or by both spin coating and slit coating.

Figure 22:
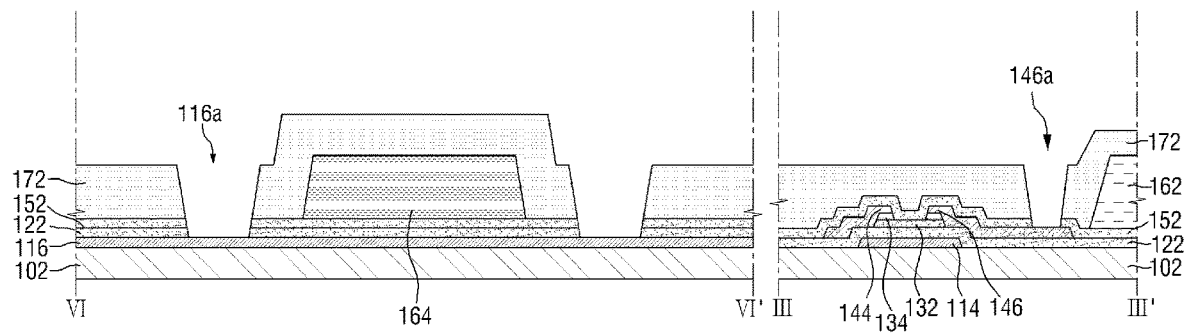

Referring to FIG. 22, a contact hole 146a that exposes at least part of the drain electrode 146 is formed in the passivation layer 152-1 and the organic layer 172-1. Specifically, an organic layer 172 is formed by forming the contact hole 146a in the organic layer 172-1, and then a passivation layer 152 is formed by forming the contact hole 146a in the passivation layer 152-1.

In some embodiments, apertures 116a that expose at least part of the first common voltage line 116 are formed in the passivation layer 152-1, the organic layer 172-1, and the gate insulating layer 122-1. Specifically, the organic layer 172 is formed by forming the apertures 116a in the organic layer 172-1, the passivation layer 152 is formed by forming the apertures 116a in the passivation layer 152-1, and then a gate insulating layer 122 is formed by forming the apertures 116a in the gate insulating layer 122-1.

Figure 23:
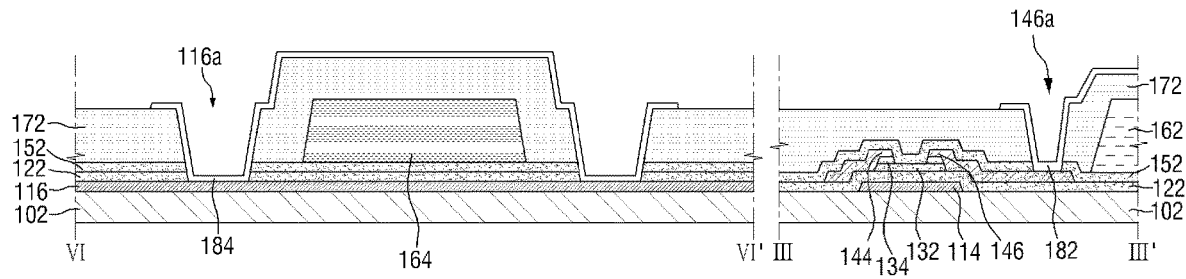

Referring to FIG. 23, a pixel electrode 182 is formed on the organic layer 172. Specifically, the pixel electrode 182 may be formed to contact at least part of the drain electrode 146 that is exposed through the contact hole 146a formed in the organic layer 172 and the passivation layer 152. Through this contact, the pixel electrode 182 may be electrically connected to or contact the drain electrode 146.

In some embodiments, a second common voltage line 184 may be formed in the same process as the pixel electrode 182. In this case, the second common voltage line 184 may be formed at the same level as the pixel electrode 182 using the same material. However, this is merely an example, and the second common voltage line 184 may be formed in a different process as that for forming the pixel electrode 182.

Figure 24:
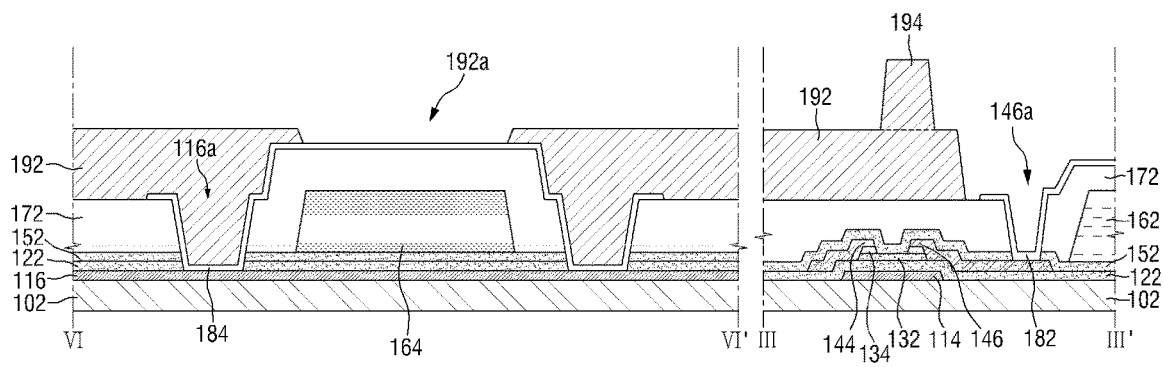

Referring to FIG. 24, a light-blocking pattern 192 is formed on the pixel electrode 182 and the organic layer 172. The light-blocking pattern 192 may be formed in an area in which liquid crystal molecules included in a liquid crystal layer 300 are inactive, such as a TFT area and a non-pixel area NDA (between pixels, a gate line area and a data line area). The light-blocking pattern 192 may be made of a black organic polymer material that contains black dye or pigment or a metal (metal oxide) such as chrome or chrome oxide.

Next, a column spacer 194 is formed on the light-blocking pattern 192. The column spacer 194 may be formed integrally with the light-blocking pattern 192, as illustrated in FIG. 24. For example, the column spacer 194 may be formed at the same time as the light-blocking pattern 192 using the same material and in the same patterning process through exposure using a halftone mask or a slit mask. However, this is merely an example, and the present disclosure is not limited to this example.

The column spacer 194 may be formed in an area corresponding to the TFT as illustrated in FIG. 24. However, this is merely an example, and the location of the column spacer 194 is not limited to this example.

The light-blocking pattern 192 includes an opening part (192a, 192b) to apply a common voltage to a common electrode 212 disposed on a second substrate 202. The opening part (192a, 192b) of the light-blocking pattern 192 may be formed in the non-display area NDA. The opening part (192a, 192b) may be formed inside the light-blocking pattern 192. More specifically, the opening part (192a, 192b) may be formed inside the light-blocking pattern 192 disposed in the non-display area NDA.

In some embodiments, the opening part (192a, 192b) of the light-blocking pattern 192 may include a first opening 192a and a second opening 192b. Referring to FIG. 1, the first opening 192a may be formed on the side of the display substrate on which a data driver 400 (on an upper side of the drawing) is formed, and the second opening 192b may be formed on the opposite side from the data driver 400 (on a lower side of the drawing). Here, the display area DA may be interposed between the first opening 192a and the second opening 192b. However, this is merely an example, and the shape of the opening part (192a, 192b) of the light-blocking pattern 192 is not limited to this example.

In some embodiments, the light-blocking pattern 192 may be manufactured using a stitch-shot method. In this case, a stitch shot that forms the light-blocking pattern 192 disposed at the left and right ends of the display panel may be different from a stitch shot that forms the light-blocking pattern 192 disposed in the central part of the display panel excluding the left and right ends thereof. The stitch shot that forms the light-blocking pattern 192 disposed in the central part of the display panel may be used successively and repeatedly. However, this is merely an example, and a method of manufacturing the light-blocking pattern 192 of the present disclosure is not limited to this example.

In the case of a large-sized panel, the light-blocking pattern 192 and the dummy color layer (164a, 164b) may generally be manufactured using a stitch-shot method. When manufactured using this method, the light-blocking pattern 192 and the dummy color layer (164a, 164b) may have different stitch-shot configurations. Therefore, the opening part (192a, 192b) of the light-blocking pattern 192 may be misaligned (in particular, in a horizontal direction of the drawings) with the dummy color layer (164a, 164b). Accordingly, light reflected by an exposed metal thereunder, e.g., the first common voltage line 116 may be seen.

In this regard, in the method of manufacturing an display device according to the current embodiment, the opening part (192a, 192b) and the dummy color layer (164a, 164b) may be implemented in the shape of lines such that the opening part (192a, 192b) of the light-blocking pattern 192 is not misaligned with the dummy color layer (164a, 164b). That is, each of the opening part (192a, 192b) and the dummy color layer (164a, 164b) may be implemented not as an intermittently broken line but as one continuous line. Therefore, even if the light-blocking pattern 192 and the dummy color layer (164a, 164b) are manufactured using the stitch-shot method, it is possible to prevent the generation of reflected light by the metal thereunder due to the misalignment of the light-blocking pattern 192 with the dummy color layer (164a, 164b).

Figure 25:
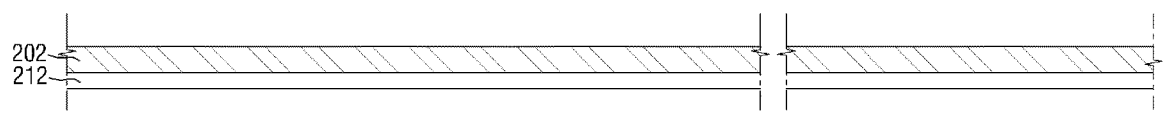

Referring to FIG. 25, the common electrode 212 is formed on the second substrate 202. The common electrode 212 may be formed as a single piece over the entire pixel area surrounded by the gate line 112 and the data line 142. The common electrode 212 may be made of a transparent conductive material, such as, but not limited to, ITO or IZO.

Next, a dam for preventing the flow of an alignment layer may be disposed on the first substrate 102 and the second substrate 202. The dam may be disposed further inwards of the first substrate 102 and the second substrate 202 than a short point. The dam may be made of, but not limited to, a material having photosensitivity.

Next, an alignment layer is formed on each of a surface of the first substrate 102 and a surface of the second substrate 202. The alignment layer may contain a resin polymer, such as polyimide, polyamic acid, polyamide, polyamide-imide, polyester, polyethylene, polyurethane or polystyrene, or a mixture of the same. In addition, the alignment layer may contain monomers of the above resin polymer.

Figure 26:
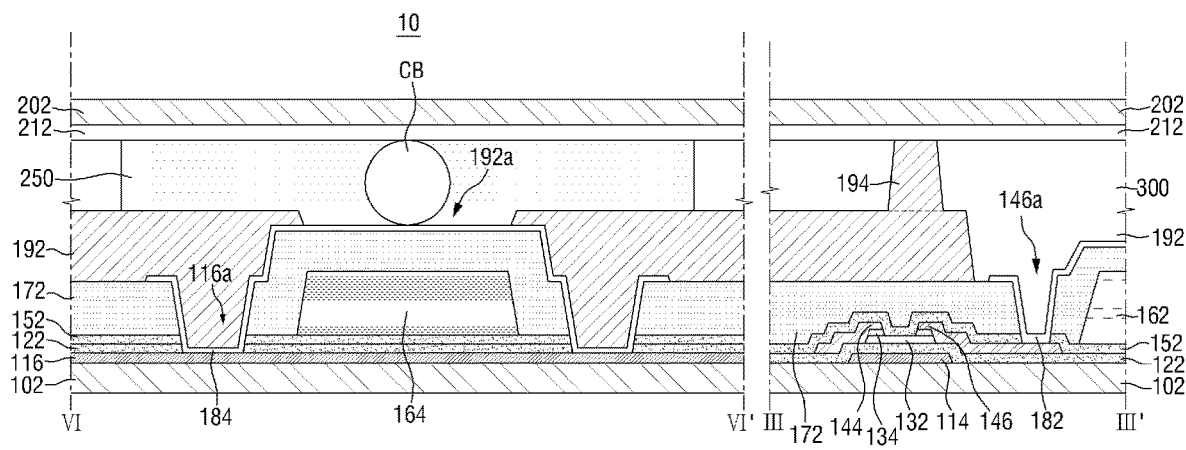

Referring to FIG. 26, the liquid crystal layer 300 is formed by coating liquid crystal molecules having positive dielectric anisotropy or negative dielectric anisotropy on the first substrate 102. Then, a first display substrate 100 having the liquid crystal layer 300 is coupled to a second display substrate 200.

A display device according to an embodiment of the present disclosure prevents reflection by a metal layer disposed under a short point.

In addition, a method of manufacturing a display device according to an embodiment may be employed to manufacture a display device that includes a structure formed using a stitch-shot method to prevent reflection by a metal layer disposed under a short point.

However, the effects of the present disclosure are not restricted to the ones set forth herein. The above and other effects of the present disclosure will become more apparent to one of daily skill in the art to which the present disclosure pertains by referencing the claims.

Although the exemplary embodiments of the present disclosure have been disclosed for illustrative purposes, the embodiments are only examples and do not limit the present disclosure. Those skilled in the art will appreciate that various modifications and applications are possible, without departing from the scope and spirit of the accompanying claims. For example, each element specified in embodiments of the present disclosure may be variously modified and implemented. Further, differences related to such modifications and applications should be interpreted as being included in the scope of the accompanying claims.

What is claimed is:

1. A display device comprising:
   a first substrate comprising a display area and a non-display area;
   a dummy color layer disposed on the first substrate in the non-display area;
   an organic layer disposed on the dummy color layer, the organic layer covering an upper surface of the dummy color layer, and a first side surface and a second side surface of the dummy color layer, the first side surface facing the second side surface;
   a light-blocking pattern disposed on the organic layer and the first substrate in the non-display area, the light-blocking pattern comprising an opening part overlapping the dummy color layer;
   a sealing member disposed on the light-blocking pattern in the non-display area;
   a common voltage line disposed between the dummy color layer and the light-blocking pattern, a portion of the common voltage line exposed by the opening part; and
   a second substrate disposed on the sealing member;
   wherein the sealing member overlaps the opening part and the dummy color layer,
   wherein the opening part, and the dummy color layer and the sealing member are each formed as a continuous line shape extending lengthwise in a direction along an edge of the display area,
   wherein the organic layer directly contacts the first side surface and the second side surface of the dummy color layer,
   wherein the light-blocking pattern is disposed between the organic layer and the sealing member,
   wherein an upper surface of the organic layer faces the sealing member,
   wherein the common voltage line directly contacts the upper surface of the organic layer, and
   wherein the light-blocking pattern directly contacts the common voltage line and a portion of the upper surface of the organic layer.

2. The display device of claim 1, wherein the first substrate further comprises a fan-out part disposed in the non-display area, and the opening part and the dummy color layer extend across the fan-out part.

3. The display device of claim 1, wherein a length of the opening part and a length of the dummy color layer are greater than a width of the display area.

4. The display device of claim 1, wherein a width of the dummy color layer measured in a direction is greater than a of the opening part measured in the direction.

5. The display device of claim 4, wherein the opening part completely overlaps the dummy color layer and the sealing member, and
   wherein the opening part is completely enclosed by the dummy color layer in a plan view.

6. The display device of claim 1, wherein the first substrate further comprises a fan-out part disposed in the non-display area and a common voltage line exposed by the opening part, wherein the common voltage line extends in a direction to traverse the fan-out part.

7. The display device of claim 1, wherein the common voltage line is disposed in the area overlapped by the area inside the sealing member.

8. The display device of claim 1, wherein the sealing member bonds the first substrate and the second substrate,
   wherein the sealing member comprises a conductive member,
   wherein a portion of an upper surface of the organic layer directly contacts the light-blocking pattern, and
   wherein the upper surface of the organic layer faces the second substrate.

9. The display device of claim 8, further comprising:
   a common electrode disposed on a surface of the second substrate, the surface of the second substrate facing the first substrate,
   wherein the conductive member is disposed between the common electrode and the portion of the common voltage line, and
   wherein the conductive member contacts the common electrode and the portion of the common voltage line.

10. The display device of claim 1, wherein the first substrate further comprises a fan-out part disposed in the non-display area and a light-blocking metal layer that is at least partially overlapped by the fan-out part.

11. The display device of claim 1, wherein the dummy color layer is blue.

12. The display device of claim 1, wherein the dummy color layer comprises a first dummy color layer and a second dummy color layer stacked sequentially, wherein the first dummy color layer and the second dummy color layer have different colors.

13. The display device of claim 12, wherein the first dummy color layer is red, and the second dummy color layer is blue.

14. The display device of claim 1, wherein the opening part comprises a first opening and a second opening that are placed to face each other with the display area interposed therebetween.

15. The display device of claim 14, wherein the dummy color layer comprises a first dummy color layer corresponding to the first opening and a second dummy color layer corresponding to the second opening.

16. The display device of claim 15, wherein the first opening and the first dummy color layer extend across the fan-out part.

17. The display device of claim 16, wherein lengths of the first and second openings and lengths of the first and second dummy color layers are greater than the width of the display area.

* * * * *